United States Patent
Tsao et al.

(10) Patent No.: US 9,177,645 B2
(45) Date of Patent: Nov. 3, 2015

(54) 10T NVSRAM CELL AND CELL OPERATIONS

(71) Applicant: Aplus Flash Technology, Inc, San Jose, CA (US)

(72) Inventors: Hsing-Ya Tsao, San Jose, CA (US); Peter Wung Lee, Saratoga, CA (US)

(73) Assignee: Aplus Flash Technology, Inc.

( * ) Notice: Subject to any disclaimer, the term of this patent is extended or adjusted under 35 U.S.C. 154(b) by 34 days.

(21) Appl. No.: 14/058,227

(22) Filed: Oct. 19, 2013

(65) Prior Publication Data

US 2014/0112072 A1 Apr. 24, 2014

Related U.S. Application Data

(60) Provisional application No. 61/716,475, filed on Oct. 19, 2012, provisional application No. 61/723,270, filed on Nov. 6, 2012.

(51) Int. Cl.
G11C 14/00 (2006.01)

(52) U.S. Cl.
CPC .................................. G11C 14/0063 (2013.10)

(58) Field of Classification Search
USPC .................... 365/154, 185.08, 185.28, 185.29
See application file for complete search history.

(56) References Cited

U.S. PATENT DOCUMENTS

| | | | |
|---|---|---|---|
| 4,703,456 A | 10/1987 | Arakawa | |
| 5,065,362 A | 11/1991 | Herdt et al. | |
| 5,563,839 A | 10/1996 | Herdt et al. | |
| 5,602,776 A | 2/1997 | Herdt et al. | |
| 5,828,599 A | 10/1998 | Herdt | |
| 5,903,561 A | 5/1999 | Kwon | |
| 6,026,018 A | 2/2000 | Herdt et al. | |
| 6,097,629 A | 8/2000 | Dietrich et al. | |
| 6,285,586 B1 | 9/2001 | Lung et al. | |
| 6,363,011 B1* | 3/2002 | Hirose et al. | 365/185.07 |
| 6,414,873 B1 | 7/2002 | Herdt | |
| 7,110,293 B2 | 9/2006 | Jung | |
| 7,164,608 B2 | 1/2007 | Lee | |
| 7,269,054 B2 | 9/2007 | Kang et al. | |
| 7,280,397 B2 | 10/2007 | Scheuerlein | |
| 7,408,801 B2 | 8/2008 | Kang et al. | |
| 7,505,303 B2 | 3/2009 | Ashokkumar et al. | |
| 7,518,916 B2 | 4/2009 | Ashokkumar et al. | |
| 7,539,054 B2 | 5/2009 | Ashokkumar et al. | |
| 7,663,917 B2 | 2/2010 | Cuppens et al. | |
| 7,710,776 B2 | 5/2010 | Johal et al. | |
| 7,760,540 B2 | 7/2010 | Still | |
| 7,859,899 B1 | 12/2010 | Shakeri et al. | |

(Continued)

Primary Examiner — Hoai V Ho
(74) Attorney, Agent, or Firm — Fang Wu

(57) ABSTRACT

A 10T NVSRAM cell is provided with a bottom HV NMOS Select transistor in each 3T FString removed from traditional 12T NVSRAM cell. A Recall operation by reading a stored ΔVt state of flash transistors into each SRAM cell uses a charge-sensing scheme rather than the current-sensing scheme, with all other key operations unchanged. The Recall operation works under any ramping rate of SRAM's power line voltage and Flash gate signal which can be set higher than only Vt0 or both Vt0 and Vt1. Alternatively, the Store operation can use a current charging scheme from a Fpower line to the paired Q and QB nodes of each SRAM cell through a paired Flash Voltage Follower that stored ΔVtp≥1.0V. The Recall operation in this alternative embodiment is to use a 7-step approach with the FN-channel erase, FN-channel program and FN-edge program schemes, including 2-step SRAM amplification.

16 Claims, 13 Drawing Sheets

(56) References Cited

U.S. PATENT DOCUMENTS

| | | |
|---|---|---|
| 7,890,804 B2 | 2/2011 | Mann et al. |
| 8,018,768 B2 | 9/2011 | Shih et al. |
| 8,036,032 B2 | 10/2011 | Scade et al. |
| 8,331,134 B2 | 12/2012 | Chiu et al. |
| 8,542,514 B1* | 9/2013 | Lakshminarayanan et al. ............... 365/63 |
| 2005/0141272 A1* | 6/2005 | Jung ................ 365/185.08 |
| 2005/0162896 A1* | 7/2005 | Jung ...................... 365/154 |
| 2006/0023503 A1* | 2/2006 | Lee .................. 365/185.05 |
| 2006/0158925 A1* | 7/2006 | Cuppens ................ 365/154 |

* cited by examiner

| Voltage | SWL | SG1 | FWL | FSL1 | FSL2 | Scheme |
|---|---|---|---|---|---|---|
| Erase | VSS | VSS | -15V | F | F | FN (Channel) |
| Program Inhibit (selected WL) | VSS | VDD | +15V | F | F | No FN |
| Program | VSS | VDD | +15V | F | F | FN (Channel) |
| Recall | VSS | F | VDD | F | F | DRAM-like Charge sharing |

FIG. 1B

| Voltage | SWL | SG1 | FWL | FSL1 | FSL2 | Scheme |
|---|---|---|---|---|---|---|
| Erase | VSS | VSS | -10V | F | F | FN (Channel) |
| Program Inhibit (selected WL) | VSS | VDD | +10V | F | F | No FN |
| Program | VSS | VDD | +10V | F | F | FN (Channel) |
| Recall | VSS | F | VDD | F | F | DRAM-like Charge sharing |

FIG. 2B

10T NVSRAM CELL AND CELL OPERATIONS

CROSS-REFERENCE TO RELATED APPLICATIONS

This application claims priority to U.S. Patent Application No. 61/716,415, filed on Oct. 19, 2012, and also claims priority to U.S. Patent Application No. 61/723,270, filed on Nov. 6, 2012, commonly assigned, and hereby incorporated by references in their entireties herein for all purposes.

This application is related to U.S. Pat. No. 7,164,608, U.S. patent application Ser. No. 14/037,356, U.S. Provisional Application Nos. 61/714,186, 61/719,344, and 61/720,385, commonly assigned, which are incorporated by reference herein for all purposes.

Additionally, this application is related to U.S. Pat. Nos. 5,065,362 and 7,760,540.

TECHNICAL FIELD OF THE INVENTION

The present embodiments relate to an improvement in NVSRAM cell size over the traditional NVSRAM cell by using fewer transistors. Merely by example, a 10T NVSRAM cell is provided with one LV 6T SRAM cell and one HV 4T Flash cell that further comprises one paired fully symmetrical 2T Flash transistors (2T) and one paired top Select transistors (2T). The same improvement method can be applied to those all NVSRAM cells that comprises at least one paired 3T flash strings, regardless of flash type made of NMOS or PMOS, regardless of 2-poly Floating-gate or 1-poly Charge-trapping SONOS and MONOS devices. In this 10T NVSRAM cell, recalling each flash stored data into each corresponding SRAM cell uses a Volatile memory (VM) DRAM charge-sharing sensing scheme to replace traditional non-volatile memory (NVM) current sensing. Alternatively, several options of performing NVSRAM Program and Erase operations under a FN-channel scheme and a FN-edge scheme are provided for above 10T NVSRAM cell.

BACKGROUND OF INVENTION

Today, a trend of high-density NMOS NVSRAM memory more than 8 Mb is required. Therefore, besides the fixed six transistors (6T) of each SRAM cell, the number of transistors of each NMOS Flash cell should be minimized as much as possible.

Traditionally, a 12T NVSRAM cell comprises one 6T LV SRAM cell and one 6T HV Flash cell including paired 3T Flash strings. Each SRAM cell has paired storage nodes of Q and QB connected to two inputs of the paired Flash strings. Each 3T Flash string further includes one (high-voltage) HV Select transistor located on top and another one on bottom, with one 2-poly HV flash transistor sandwiched in the middle of above two HV Select transistors.

Each paired drain nodes of the paired Flash strings are preferably connected to each paired nodes of Q and QB of each 6T LV SRAM cell directly. Conversely, the paired source nodes of each paired Flash strings are connected to a common VDD power supply to provide the different current flows to charge each paired nodes of Q and QB at two different voltage levels for each SRAM cell's subsequent amplification through two different programmed channel threshold levels Vts of each paired Flash transistors during the Recall operation.

Although several NVSRAM approaches were disclosed before, the 12T NVSRAM using low-current FN-channel program and FN SBPI method is prevailing in the market place. The flash type can be either made of 1-poly charge-trapping SONOS or MONOS type from Cypress or 2-poly floating-gate NMOS or PMOS type from Aplus Flash Technology, Inc., or a trigate flash technology from Simtek. By 2012, the highest density of a 12T NMOS NVSRAM memory in production is 16 Mb.

There are five key fundamental operations associated with the 12T NVSRAM cell memory, as summarized here: 1) SRAM's LV Read and Write operation; 2) Flash's HV FN-channel Program operation; 3) Flash's HV FN-channel Erase operation; 4) NVSRAM Store operation; and 5) NVSRAM Recall operation.

The Store operation is defined to program each SRAM cell logic data into each corresponding Flash cell. This is like a Flash FN-channel Program operation as described in operation 2). This operation can be further divided into three sub-operations as shown below:

a) Auto-Store operation: This operation is defined to be performed when a first regular VDD power supply is removed and replaced by a second VDD back-up power supply by using an off-chip Vcap or Vbat.

b) Software-Store operation: This operation is defined to be performed during stable VDD period and is called by a defined sequence of software steps.

c) Hardware-Store operation: This operation is defined to be performed during stable VDD period and is called by a hardware pin by system Multipoint Control Unit (MCU).

The Recall operation is defined to transfer each Flash cell logic data into each corresponding SRAM cell. This operation is like a Flash Read operation. This operation can be divided into three sub-operations as shown below:

a) Auto-Recall operation: This operation is defined to be automatically performed during the power-up period of a first regular VDD power supply once the VDD ramping voltage level reaches above the predetermined voltage, such as 80% of the final stable VDD power.

b) Software-Recall operation: This operation is defined to be performed during stable VDD period and is called by a defined sequence of software steps.

c) Hardware-Recall operation: This operation is defined to be performed during stable VDD period and is called by a hardware pin by system MCU.

For example, in a U.S. Pat. No. 5,065,362, a 12T non-volatile RAM cell was provided with the flash cell being a 1-poly trigate cell structure. The biased conditions for program operation is: Flash word line FWL=+15V, source line FSL=0V, with Flash cell Vt≥+2V; for erase operation: FWL=−15V, FSL=0V, with Flash cell Vt≤−2V. In another example of U.S. Pat. No. 7,760,540, a 12T non-volatile SRAM cell was provided with the flash cell being a 1-poly charge-trapping SONOS or MONOS cell structure. The associated bias conditions for program operation is: FWL=+10V, FSL=0V, with Flash cell Vt≥+2V; for erase operation: FWL=−10V, FSL=0V, with Flash cell Vt≤−2V. In yet another example, as shown in a U.S. Pat. No. 7,164,608, granted to the same inventor of the present application, another 12T NVSRAM cell with a 2-poly floating-gate flash cell structure is provided. The biased conditions for program operation is: Flash word line FWL=+15V, source line FSL=0V, with Flash cell Vt≥+2V; for erase operation: FWL=−15V, FSL=0V, with Flash cell Vt≤−2V.

One big drawback of this 12T NMOS NVSRAM memory is its large 12T cell size that comprises one 6T LV SRAM cell and one 6T HV Flash cell. And each 6T Flash cell further comprises one paired 3T FStrings and each FString further comprises one top HV Select transistor, one bottom HV Select transistor, and one flash transistor sandwiched by two Select transistors in the middle.

Due to three transistors of each Flash string have to be made of all HV devices to sustain a HV of 5-7V generated by a SBPI (Self-Boosting Program-Inhibit) scheme during the FN-Channel Program operation of NVSRAM cell, the channel length of these two HV Select transistors are made relatively bigger than the ones of a LV SRAM two PMOS transistors and four NMOS transistors. As a result, it is desirable to achieve any saving of each HV Select transistor in each Flash string so as to drastically reduce the NVSRAM cell size for cost reduction.

SUMMARY OF THE INVENTION

The present embodiment specifically relates to an improvement in reducing NVSRAM cell size over the traditional 12T NVSRAM cell. A preferred 10T NVSRAM cell is provided by removing one bottom HV Select transistor from each 3T Flash string. Thus one paired Flash strong would save two HV Select transistors.

One reason the preferred 10T NVSRAM can use the fewer number of 10T to perform the same key operations as a 12T NVSRAM cell in prior art is because recalling each flash stored data into each corresponding SRAM cell of a NVSRAM has been changed by using the conventional VM DRAM charge-sharing sensing scheme with both flash source lines being left floating to replace the traditional NVM current sensing scheme used by the 12T NVSRAM cell. The details of the read operation of this novel 10T NVSRAM will be explained subsequently in this description.

In an embodiment, the present invention provides a 10T NMOS NVSRAM cell that comprises one 6T LV SRAM cell and one HV 4T Flash cell without bottom Select transistor in each traditional 3T Flash string. The NMOS Flash string comprises just two HV NMOS transistors that include only one top HV Select transistor and one HV Flash transistor with its source node preferably left in floating. The NMOS flash type can be made of either 1-poly charge-trapping type (MONOS or SONOS) as defined by Cypress and Simtek (Trigate without the bottom select transistor), or the 2-poly floating-gate type defined by Aplus Flash Technology.

The present invention discloses that, except for the Recall operation, the biased conditions of FN-channel Erase, FN-channel Program, and the SRAM Read and Write, and NVSRAM's Store operations from the traditional 12T NMOS NVSRAM cell can be kept the same in the 10T NMOS NVSRAM cell of the present invention. The Store operations include Auto-Store, Software-Store, and Hardware-Store as defined by conventional NVSRAM specifications. Similarly, the Recall operations include Auto-Recall, Software-Recall, and Hardware-Recall as defined by conventional NVSRAM specifications.

In another embodiment, the present invention discloses a preferred DRAM-like Read operation for performing Recall operation of the 10T NVSRAM cell. This is to convert two different Vts stored in the paired Flash cell into two different charges loaded to the SRAM paired nodes of Q and QB where the charges are amplified with a logic state in accordance with each flash stored logic state. The details of the definition of the stored Flash Vts and logic state can referred to in all prior art 12T NVSRAM cell definition.

In yet another embodiment, the present invention discloses that during a final charge amplification stage, each SRAM power VDD ramp speed is non-critical and completely flexible. Thus any ramping rate of SRAM's power line can be set arbitrarily to ease the Recall operation design with this 10T NVSRAM cell design.

In still another embodiment, the present invention discloses that in order to compensate for any potentially unmatched parasitic capacitance in certain extent between Q and QB and 2T Flash drain nodes in the 10T NVSRAM cell, the channel length of the paired flash transistors can be increased from 1-fold to 10-fold or any arbitrary number larger than 1 to ensure the coupling charges from the paired flash transistors are dominated only by the Vt difference, rather than by the mismatches of the parasitic capacitance. The mismatched parasitic capacitance includes the mismatched devices and PN junction profiles of two PMOS devices and four NMOS devices in each 6T SRAM cell, the mismatched devices of the top Select HV NMOS transistors, and the mismatched metal connection between Q and QB to the paired drain nodes of top HV Select transistors.

In a specific embodiment, the present invention provides a method for operating the Recall operation of this preferred 10T NVSRAM cell. Unlike the 12T NVSRAM cell Recall operation, VDD power supply to the common sourceline of a 3T flash string is not needed. The only signal required to transfer each stored flash data into each SRAM cell is using a proper gate voltage on the paired Flash transistors. In this 10T NVSRAM cell, Flash gate (connected to flash word line FWL) is preferably coupled to a full or partial VDD power level at least higher than Vt0 of one flash transistor. While another paired flash transistor storing with complementary Vt1 becomes "Don't-care."

In another specific embodiment, the present invention discloses that a ramp rate of Flash gate voltage is non-critical and can be very flexible in terms of speed. The Recall operation is proven still fully functional by simulation results.

In an alternative embodiment, the present invention discloses a method of using a low-current FN-channel Erase scheme to decrease both flash transistor Vts with a same initial low Vt by applying a negative HV of VNN to the paired flash gates (FWL) with the paired flash transistor's bulk held at VSS (ground).

In yet another alternative embodiment, the present invention provides another set of program and erase schemes for the 10T NVSRAM cells by using VPP FN-channel scheme as an Erase operation to preferably increase both flash transistor Vts to a same initial value above VDD along with using a VNN FN-edge scheme with a full passage of the VDD and VSS inputs respectively from the paired Q and QB nodes by setting Select gate control signals SG1 and SG2 higher than VDD+Vt to achieve the desired ΔVt≥1.0V.

In still another alternative embodiment, the present invention provides a preferred Recall operation that uses a current Charging scheme from a common Flash power line to the paired Q and QB nodes of each SRAM cell through the paired Flash transistors stored with a preferred Vt difference ΔVts≥1V. The different voltage levels at Q and QB nodes of each SRAM cell are subsequently amplified by a 2-step SRAM operation by ramping SRAM VDD line voltage from a preset value of VSS to VDD first followed by ramping down the SRAM VSS line voltage from a preset value of VDD to VSS. The amplification method includes presetting the Q and QB to be VSS initially that are coupled to the paired flash transistor channels for a preferred FN-channel Erase operation with the paired Flash gates connected to VPP.

In yet still another alternative embodiment, the present invention provides a method for setting initial power lines of each 6T SRAM cell to VDDP and VSSP in a reversed manner for cancelling the mismatches of the paired NMOS devices in each SRAM cell without consuming any DC standby current. The reversed initial setup means setting VDDP to VSS but VSSP to VDD. Note that the NW nodes of both Inverters of the SRAM cell are kept at VDD.

In a specific embodiment, the present invention provides a 10T NVSRAM memory cell circuit with reduced cell size and a DRAM-like charge-sensing scheme. The 10T NVSRAM memory cell includes a SRAM cell comprising two inverters cross-coupled to a first pass transistor and a second pass transistor commonly gated by a first word line and respectively coupled drains to a first bit line and a second bit line and sources to a first data node and a second data node. The first data node and the second data node respectively are outputted from the two invertors. Each inverter includes a PMOS device connected to a first power line and a NMOS device connected to a second power line. The first power line and the second power line are operated between a VDD power supply and ground and are separated from a common Nwell node. Moreover, the 10T NVSRAM cell includes a Flash cell including a first cell string and a second cell string sharing a common P-sub. The first/second cell string includes a first/second Select transistor and a first/second Flash transistor connected in series. The first and the second Select transistors are gated commonly by a select-gate control line and respectively associated with a first drain terminal coupled to the first data node and a second drain terminal coupled to the second data node. The first and the second Flash transistors being gated commonly by a second word line and respectively associated with a first source terminal and a second source terminal. The first source terminal and the second source terminal are floating. The second word line is configured to ramp up to a voltage above the VDD level sufficient to couple two different charge levels respectively from the first Flash transistor and the second Flash transistor to the first data node and the second data node. The SRAM cell uses the two cross-coupled inverters to amplify the two different charge levels to one at the VDD level and another one at VSS in a two-step operation.

In another specific embodiment, the present invention provides an alternate 10T NVSRAM memory cell circuit with a current-charging scheme. The 10T NVSRAM memory cell includes a SRAM cell comprising two inverters cross-coupled to a first pass transistor and a second pass transistor commonly gated by a first word line and respectively coupled drains to a first bit line and a second bit line and sources to a first data node and a second data node. The first data node and the second data node respectively being outputted from the two invertors. Each inverter includes a PMOS device connected to a first power line and a NMOS device connected to a second power line. The first power line and the second power are operated between a VDD power supply and a ground level VSS=0V. Moreover, the 10T NVSRAM cell includes a Flash cell comprising a first cell string and a second cell string sharing a common P-sub. The first/second cell string includes a first/second Select transistor and a first/second Flash transistor connected in series. The first and the second Select transistors are gated commonly by a select-gate control line and respectively associated with a first drain terminal coupled to the first data node and a second drain terminal coupled to the second data node. The first and the second Flash transistors are gated commonly by a second word line and respectively associated with a first source terminal and a second source terminal. The first source terminal and the second source terminal are coupled to a third power line. The third power line is configured to ramp up to the VDD level to cause two different currents flown through the first Flash transistor and the second Flash transistor associated with a threshold level difference greater than 1V to generate two different charge levels at the first data node and the second data node in a Recall operation. The two cross-coupled inverters are configured to amplify the two different charge levels to one at the VDD level and another one at VSS=0V by sequentially ramping the first power line from a preset VSS=0V to the VDD level followed by ramping the second power line from a preset the VDD level to VSS=0V.

In an alternative embodiment, the present invention provides a method for performing a Recall operation of a 10T NVSRAM memory cell circuit under a current-charging scheme. The method includes providing a 10T NVSRAM cell associated with a NVSRAM memory. The 10T NVSRAM cell includes a SRAM cell comprising two inverters cross-coupled to a first pass transistor and a second pass transistor commonly gated by a first word line and respectively coupled drains to a first bit line and a second bit line and sources to a first data node and a second data node. The first data node and the second data node respectively are outputted from the two invertors. Each inverter includes a PMOS device connected to a first power line and a NMOS device connected to a second power line. The first power line and the second power are operated between a VDD power supply and a ground level VSS=0V. Moreover, the 10T NVSRAM cell includes a Flash cell comprising a first cell string and a second cell string sharing a common P-sub. The first/second cell string includes a first/second Select transistor and a first/second Flash transistor connected in series. The first and the second Select transistors are gated commonly by a select-gate control line and respectively associated with a first drain terminal coupled to the first data node and a second drain terminal coupled to the second data node. The first and the second Flash transistors are gated commonly by a second word line and respectively associated with a first source terminal and a second source terminal. The first source terminal and the second source terminal are coupled to a third power line. Additionally, the method includes performing a Recall operation to write a flash logic state stored in the Flash cell using a current-charging scheme from the third power line to the first data node and the second data node of the SRAM cell through the first Flash transistor and the second Flash transistor associated with a corresponding threshold level difference at least greater than 1V. The threshold level difference leads to a voltage difference at the first data node and the second data node and the voltage difference is subsequently amplified by the SRAM cell by ramping the first power line from a preset value of VSS to the VDD level first and ramping the second power line from a preset value of the VDD level to VSS.

As a result, the traditional 12T NVSRAM cell would be reduced to only 10 transistors. Because each Select transistor is a HV device with larger channel length, the cell size saving of NVSRAM is more than the simple ratio of 10/12. In addition to the space saved from removing two HV bottom Select transistors, a common sourceline of each paired Flash strings can be also removed from each flash cell to leave source node floating if a DRAM-like charge-sensing scheme is used for SRAM Recall operation. Alternatively, the Store operation of the 10T NVSRAM cell can be operated by using a current-charging scheme from a shared Fpower line to draw VDD power to send current to charge the paired Q and QB nodes of each 6T SRAM cell through the paired Flash cell acted as Voltage Follower that stored $\Delta Vtp \geq 1.0V$. Each SRAM's amplification is preferably divided into a 2-step approach by first ramping down SRAM power line VSSP from the VDD level to VSS=0V, and conversely ramping up SRAM power line VDDP from VSS to the VDD level. After this 2-step SRAM amplification process, the Q and QB node voltage difference of about 0.4V can be fully amplified to VDD and VSS digital levels to define standard SRAM logic state. In addition, the FN-channel erase, FN-channel program and FN-edge program schemes can be flexibly used for operating these 10T NVSRAM cell at VDD operation as low as 1.2V without need of SBPI method, thus no top and bottom Select transistors are really required. The final effective area saving in this 10T NVSRAM cell size is about 25% compared to the conventional 12T NVSRAM cell size. For today's NVSRAM design with a demand for density higher than 4 Mb, the die size saving is more than 20% because a typical NVSRAM cell array takes up more than 80% of the total final die size due to high array efficiency.

BRIEF DESCRIPTION OF THE DRAWINGS

FIG. 1B is a table that contains the biased conditions of four key operations of this 10T NVSRAM cell of FIG. 1A.

FIG. 2B is a table that contains the biased conditions of four key operations of this 10T NVSRAM cell of FIG. 2A.

DETAILED DESCRIPTION OF THE INVENTION

Figure 1A:
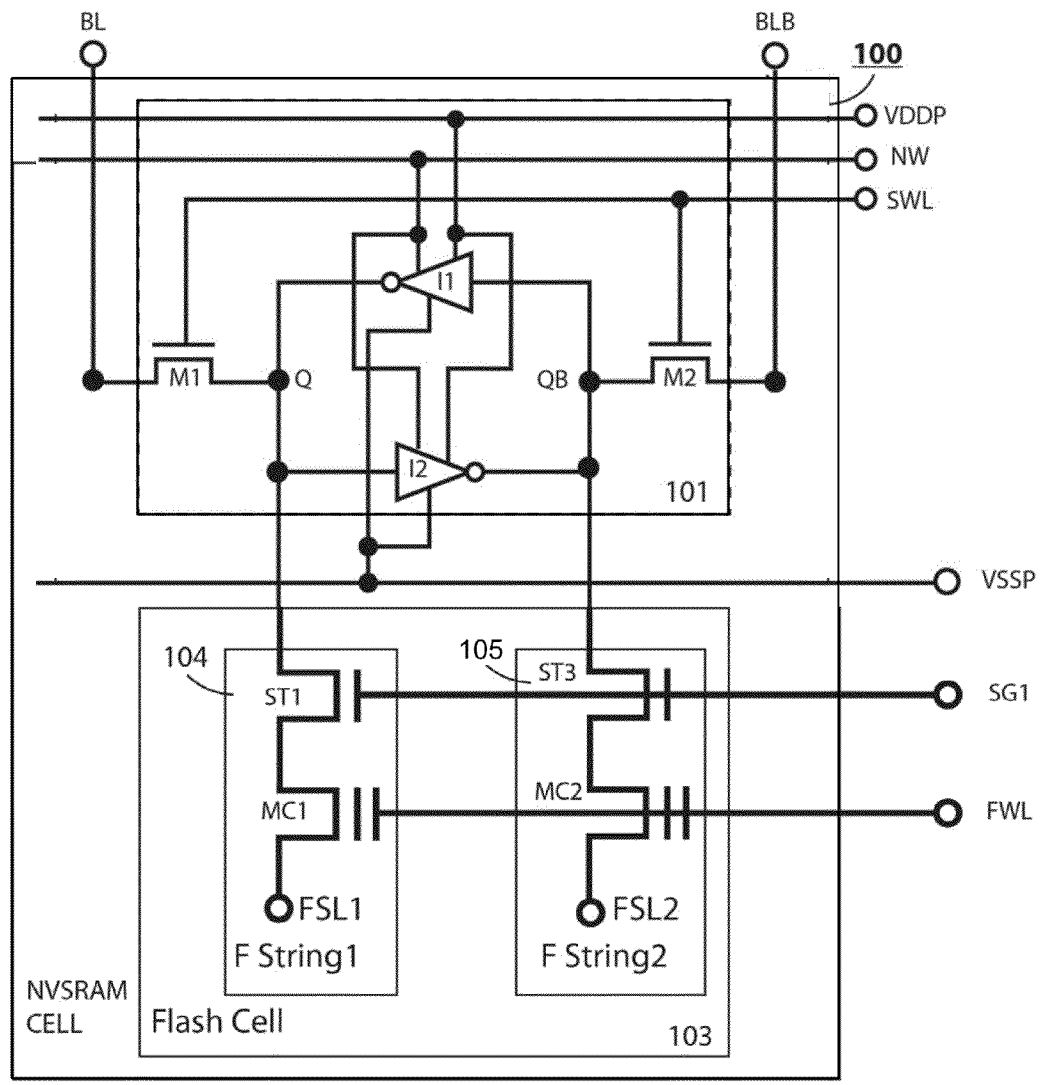
FIG. 1A is a circuit diagram of a 10T 2-poly NMOS floating-gate flash type NVSRAM cell according to an embodiment of the present invention.

The present invention is related to improvement in NVS-RAM cell size over the traditional 12T NVSRAM cell by using fewer transistors, becoming a 10T NVSRAM cell. The 10T NVSRAM cell can be configured to in several biased conditions for successful NVSRAM operation. The same cell-size reduction improvement can be applied to those all NVSRAM cells that comprises at least one paired 3T Flash strings, regardless of flash type made of NMOS or PMOS, regardless of 2-poly Floating-gate or 1-poly Charge-trapping SONOS or MONOS devices. A preferred 10T NVSRAM cell is provided by removing one bottom HV Select transistor from each 3T Flash string. Thus one paired Flash strong would save two HV Select transistors.

In a specific embodiment, the 10T NVSRAM cell circuit can be configured by removing one paired HV bottom Select transistors from the traditional 12T NVSRAM cell that comprises one 6T LV SRAM cell and one HV flash cell that further comprises one paired 3T flash FStrings. Each 3T flash string comprises one top HV Select transistor, one bottom HV Select transistor and one Flash transistor in middle. Once the bottom HV Select transistor is removed or deleted, then each 3T flash String in 12T NVSRAM cell becomes 2T Flash String in this 10T NVSRAM cell.

As we show below, only the operating conditions of three Recall operations, Auto-Recall, Software-Recall, and Hardware-Recall, are made differently from the conventional 12T NVSRAM cell due to the removal of two HV bottom Select-transistors from each 12T NVSRAM cell. The detailed operating conditions of this preferred new Recall operations of the present invention will be disclosed subsequently in this description. However, other NVSRAM basic biased operations such as LV SRAM operation, HV Flash FN Erase, and HV FN Program operations and three Store operations remain identical. Similarly, in this new 10T NVSRAM memory system, a second back-up VDD supply of either Vcap or Vbat can be also utilized for the above said Auto-Store operation when the first VDD supply is removed.

In particular, the top paired HV Select transistors are not required because each SRAM Q and QB nodes will couple the paired logic of VDD/VSS or VSS/VDD to one paired FString's drain nodes. The FString that sees VDD on its drain node will have a stronger electric field for an erase operation than the Fstring drain node coupled with 0V. Thus, without top Select transistors, both the paired flash cells would be erased without a problem. As a conclusion, during 12T NVS-RAM cell Erase operation, both top and bottom Select transistors are actually not required at all in the circuit.

Conversely, during the FN-channel program operation using the SBPI Program-Inhibit scheme, one paired gates of the top paired Select transistors are coupled to VDD to connect SRAM Q and QB nodes to the paired flash cells within the paired FStrings. During Program and Program-Inhibit operations, one flash's channel would be held at VSS level, while another flash channel would be boosted to around 5-7V due to SBPI. In order to keep this SBPI voltage of 5-7V within the non-selected program flash transistor, the bottom paired Select transistors have to remain off during the program course. That means both gates of the bottom paired HV Select transistors have to be coupled to VSS to remain in non-conduction state to prevent SBPI voltage from leaking to VSS to ensure success in the Program-Inhibit operation.

Therefore, the bottom Select transistor in each FString is also not required at all during the FN-channel program and Program-Inhibit operations. From the circuit viewpoint, the most effective way to prevent SBPI-induced 5-7V from leaking to VSS and keep inside the channel of non-selected program flash transistor is to remove the bottom Select transistor.

Since the definition of Store operation is actually a Program operation in NVSRAM, the bottom Select transistor is not required in all Store operations, regardless of whether it is Auto-Store operation done in power-off period, or Software and Hardware store operation during the stable VDD operation and initiated by system MCU.

Therefore, the bottom Select transistor in each 3T Flash string of 12T NVSRAM cell is not actually required for some conventional NVSRAM operations such as Erase, Program, Store and SRAM operation. The only last NVSRAM operation left to check if the bottom Select transistor is required is the Recall operation.

The definition of NVSRAM's Recall operation is to transfer the stored data in each paired flash transistors of each flash cell into each corresponding SRAM cell. As a result, the NVSRAM's Recall operation involves two steps. The first step involves a LV Flash Read operation followed by a second step of a LV SRAM Write operation with two complementary voltages inputs from the paired Flash transistors presented to the paired nodes of Q and QB of SRAM. In prior art, three gates of Flash string have to be coupled with a VDD voltage to allow the top and bottom Select transistors acting as a pass-transistors and the difference of two flash stored Vts such as Vt0 (−2V) and Vt1 (2V) to be sensed and amplified. The last step of Recall operation is to connect flash common source node to the VDD power supply, the low Vt0 flash transistor will conduct more current than the Vt1 flash transistor to charge Q and QB nodes of a corresponding SRAM cell. As a result, each SRAM cell will be written into the desired logic state in accordance with the logic state stored in the paired flash transistors after Recall operation, regardless of whether it is "Auto-Store", or "Software-Store", or "Hardware Store."

In summary, in examining all above key operations of a traditional 12T NVSRAM cell, only the Recall operation may need to keep the bottom Select transistor in each 3T Flash String because the scheme of Recall is to detect the charging current difference between two respective flash strings from flash common source line SL, which is connected to VDD power, to each SRAM Q and QB nodes through the paired Flash transistors that store two complementary Vts such as one low Vt0 and one high Vt1.

However, in a specific embodiment of the present invention, a method is provided to get rid of these two bottom Select transistors from 12T NVSRAM cell to turn into a 10T NVSRAM cell without affecting the Recall operation. In particular, instead of sensing different current flow through two Flash strings in 12T NVSRAM cell, the present 10T NVSRAM cell uses a preferred DRAM-like Read scheme that senses the charge-difference stored in the paired flash transistors due to different stored Vts such as Vt0 and Vt1.

As a result, the 10T NVSRAM's Recall sensing scheme does not need flash string current flow, but requires charge-sharing. Therefore, the bottom Select transistor in each 3T Flash String is not needed so that a 3T FString can be reduced to a 2T Flash String and 12T NVSRAM becomes 10T NVSRAM cell. By using the present 10T NVSRAM cell, the die and cell size of NVSRAM memory can be drastically reduced.

FIG. 1A is a circuit diagram of a 10T 2-poly floating-gate NMOS NVSRAM cell according to an embodiment of the present invention. This diagram is merely an example, which should not unduly limit the scope of the claims. One of ordinary skill in the art would recognize many variations, alternatives, and modifications. As shown, the preferred NMOS, 2-poly, 10T NVSRAM cell 100 includes one LV 6T SRAM cell 101 with paired nodes of Q and QB and one 4T Flash cell 103 having a pair of 2T Flash strings 104 and 105 with one paired input nodes respectively connected Q and QB along with two separate source nodes of FSL1 in 2T Fstring1 and FSL2 in another 2T FString2. Note, both FSL1 and FSL2 are preferably left floating to save cell size without degrading the performing of the present invention.

The LV 6T SRAM cell 101 includes two Inverters I1 and I2 cross-connected to two source nodes of two LV NMOS devices M1 and M2. The two source nodes are also data nodes Q and QB respectively outputted from I1 and I2 which are powered through two common power line, VDDP and VSSP. The VDDP line connects to PMOS devices in the two Inverters I1 and I2. VSSP line connects to NMOS devices in the two Inverters. Typically, VDDP line is coupled to a VDD power supply and VSSP line is grounded to VSS=0V. Or they can be reversely connected to VSS and VDD for certain SRAM operation. Both power lines are separated from a common Nwell region of the SRAM cell 101, which is connected to a NW node isolated electrically from the VDDP line and VSSP line.

The NMOS, 2-poly, Flash cell (circuit) 103 includes one pair of NMOS, HV, 2T, 2-poly Flash strings, FString1 104 and FString2 105. Each NMOS Flash string, FString, comprises two NMOS transistors (2T) such as ST1 and MC1 in FString1 and ST3 and MC2 in FString2 with only two separate gate signals such as SG1 and FWL.

The first 2T Flash string includes one preferred 1-poly Select transistors (1T) of NMOS HV ST1 with poly2 and poly1 shorted together and one 2-poly, floating-gate type, NMOS Flash transistor MC1 in FString1. Similarly, the second two HV NMOS transistors (2T) include one1-poly NMOS HV Select transistors (1T) of ST3 and one 2-poly NMOS Flash transistor of MC2 in FString2.

In a 10T NVSRAM Store operation, each SRAM bits logic state is automatically written into the paired MC1 and MC2 only because there is only one Flash bit upon power loss. Conversely, in a 10T NVSRAM Recall operation, the Flash bits stored logic state in MC1 and MC2 would be automatically loaded into each SRAM bit upon power up.

The details of the biased conditions of all key operations in this preferred 10T NVSRAM cell of FIG. 1A are explained below.

SRAM operation: This is an LV VDD operation.

Flash biased conditions: Select gate signal SG1=VSS, flash gate signal FWL=X, X stands for "Don't-care" means the voltage can be left to either VDD or VSS=0V. But in Recall operation, it should be started from VSS.

SRAM biased condition: wordline SWL=VDD for selected row, but SWL=VSS for unselected rows. The SRAM cell is operated at the VDD coupled to VDDP and VSS=0V for grounding the VSSP.

Under the above preferably biased conditions for respective SRAM and Flash cells, the flash bit is totally out of circuit. In other words, FString1 and FString2 are in high-impedance state to each SRAM's paired output nodes of Q and QB. Thus each SRAM cell's operation would not be affected by the Flash cell.

Flash FN-channel Erase operation: This is a −HV operation similar to that for the traditional 12T NVSRAM cell.

Flash erased biased conditions: SG1=VSS, FWL=VNN (a negative high voltage), Psub=0V, sourcelines FSL1=FSL2=floating.

SRAM biased conditions: SWL=VSS or "X", "X" means "Don't-care."

The VNN −HV operation is defined to remove the plurality of electrons from floating-gate of 2-poly flash cell or Nitride layer of 1-poly flash cell type. After Erase operation, the NVSRAM Flash cell's Vt would be decreased to Vt0 with a preferred value below −2.0V. But in this invention, the absolute value of Vt0 is not important. Instead, the ΔVt=Vt1−Vt0 is important. The Erase operation uses FN-channel tunneling scheme that requires a negative HV of VNN that varies from −15V to −18V on flash gate with respect to a VSS channel and P-substrate. The erase time is set to be less than 10 ms if the coupling ratio from poly2 to channel of flash cell is large enough to remove the electrons within 10 ms.

Flash FN-channel Program and Program-Inhibit biased conditions: This is a similar +HV FN-channel operation similar to the conventional 12T NVSRAM cell operation.

The Program operation is preferably performed after flash Erase operation with a same initial Vt0 on both MC1 and MC2. After Program operation, the NVSRAM Flash cell's Vt would be increased.

Flash biased conditions: SG1=VDD, FWL=VPP (a positive high voltage), FSL1=FSL2=floating.

SRAM biased conditions: SWL=VSS and each SRAM cell loaded with a preferred logic state initially. When SRAM data is loaded with a preferred "0" logic state, then Q=VSS and QB=VDD. Conversely, When SRAM data is loaded with a preferred "1" logic state, then Q=VDD and QB=VSS initially.

Under initial setup conditions of SG1=FWL=VDD and SRAM's "0" logic state, the MC1 flash channel voltage would be VSS because it is connected Q=VSS and MC2's channel would be VDD-Vt because it is connected to QB=VDD through ST3, where Vt1 is the threshold Vt of the top Select HV NMOS transistor of ST3 or ST1.

When FN-channel Program operation starts, the FWL voltage ramps from initial VDD level to a final value of VPP, which is a +HV, ranging from +15V to +18V for a 2-poly flash cell, or +10V for a 1-poly NONOS flash cell. After VPP FN-channel Program operation within a desired 10 ms program time, the MC1 flash cell with channel held at VSS would get programmed, but MC2 with channel held at initial VDD-Vt floating state would be coupled to high, and get Program-Inhibited due to the SBPI-induced 5-7V would occur in MC2's channel.

As a result, the MC1 Vt would be increased from Vt0 to Vt1, while the MC2 Vt would remain at Vt0 without being increased. Thus each flash logic state is opposite to the logic state of each SRAM cell after FN-channel Program similar to that defined in traditional 12T NVSRAM cell.

FIG. 1B shows a table that lists biased conditions of key operations of the 10T NVSRAM cell of FIG. 1A in accordance with an embodiment of the present invention. As shown, four key NVSRAM operations are described.

Erase operation: This operation is performed on flash cells only, with SRAM cell isolated by setting SG1=VSS and SWL=VSS. However, SWL=VDD is allowed. Both MC1 and MC2 gates are coupled to a VNN of −15V. As a result, both MC1 and MC2 Vt would be decreased to Vt0 simultaneously after a predetermined erase time less than 10 ms.

Program operation: This operation is performed reversely to the above Erase operation. But again, on flash cells only with SRAM cell isolated by setting SG1=VSS and SWL=VSS. But SWL=VDD is allowed. Both MC1 and MC2 gates are coupled to a VPP of +15V or higher. As a result, both MC1 and MC2 Vt would be increased to a complementary Vt0 and Vt1 in accordance with the logic state of each corresponding SRAM logic state after a predetermined program time less than 10 ms.

Program-Inhibit operation: The flash transistor with its drain node connected to VDD would become floating in the beginning and later will be boosted to a 5-7V by SBPI scheme. As a result, no FN tunneling happens, thus this flash transistor Vt would remain Vt0. Conversely, the flash transistor with VSS in the channel would be programmed to Vt1.

Recall operation: DRAM-like charge-sensing scheme is used. Details will be illustrated with respect to a simulation circuit and associated waveforms in several sections below.

Figure 2A:
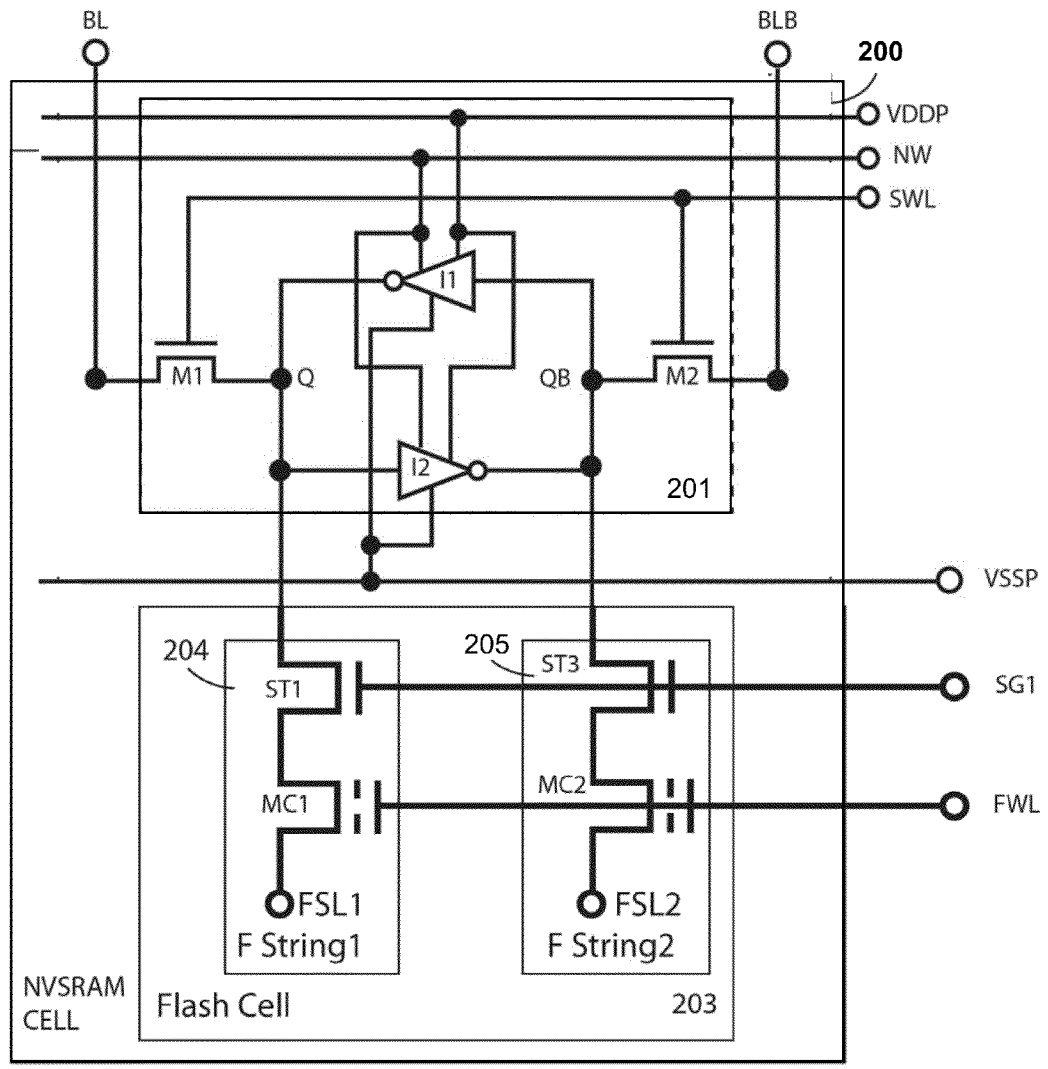
FIG. 2A is a circuit diagram of a 10T 1-poly SONOS or MONOS charge-trapping flash type NVSRAM cell according to an embodiment of the present invention.

FIG. 2A shows another 10T NVSRAM cell with 1-poly charge-trapping SONOS or MONOS flash type according to another embodiment of the present invention. As shown, 10T NVSRAM cell 200 includes one 6T LV SRAM cell 201 with one HV 4T Flash cell 203. Each Flash cell 203 further includes one paired 2T FStrings 204 and 205. Each 2T flash string comprises one ST1 top Select NMOS transistor and one 1-poly Flash transistor MC1 in SFstring1 204 and one ST3 top Select NMOS transistor and one 1-poly Flash transistor MC2 in SFstring2 205.

FIG. 2B is a table that contains the biased conditions of four key operations of this 10T NVSRAM cell of FIG. 2A. Except for the +HV VPP of +10V and −HV VNN of −10V being different from the VPP and VNN values used in FIG. 1B, the bias conditions of all operations would be substantially the same as those for 10T NVSRAM cell of FIG. 1A. Thus the description of Table FIG. 2B is omitted here for brevity.

Figure 3:
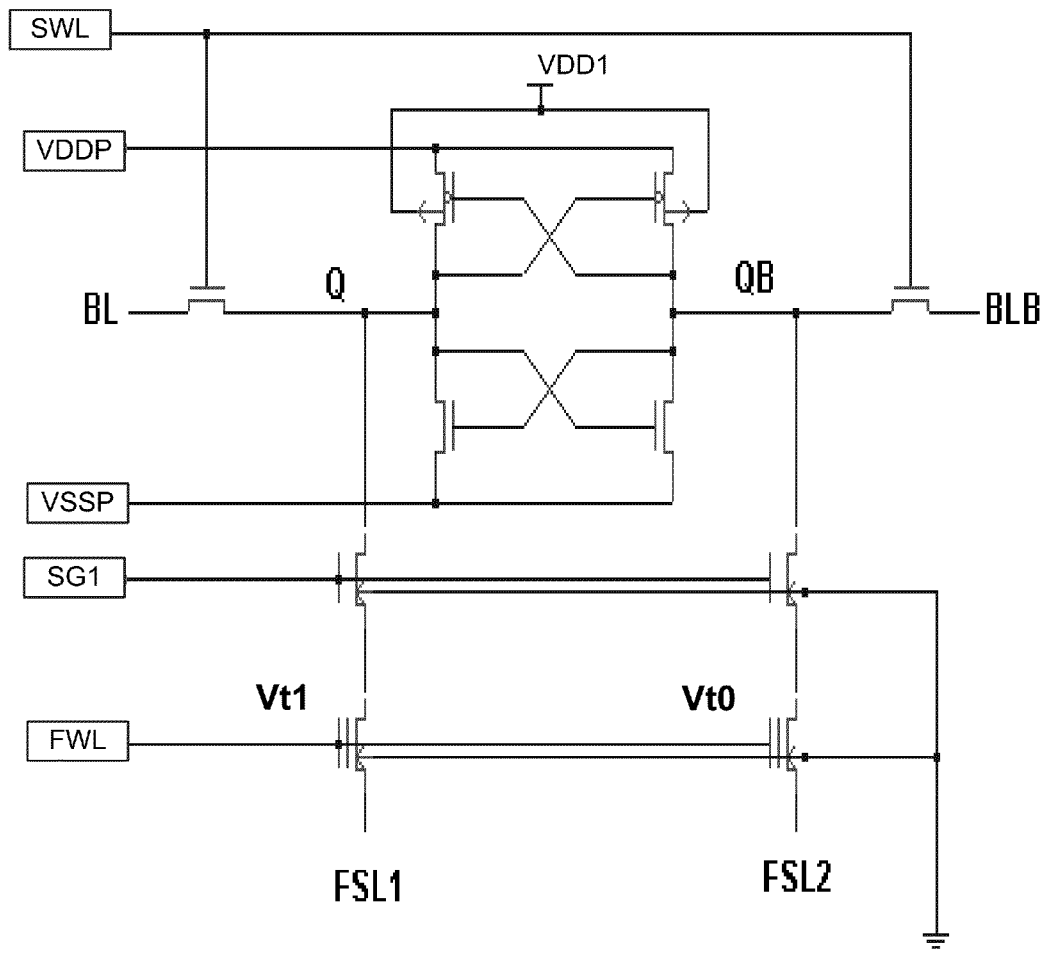
FIG. 3 is a simulation circuit of a 10T NVSRAM cell with some assumed capacitance loading placed at Q and QB nodes of 6T SRAM in accordance with the present invention.

FIG. 3 shows a simulation circuit of the present 10T NVSRAM cell with some assumed capacitance loading CC1 and CC respectively placed at Q and QB nodes of 6T SRAM for simulation. Since the flash cell is an NMOS device, thus total of four transistors are made on top of P-sub. Top Inverter is connected to power line VDDP, bottom Inverter is connected to VSSP as shown. On the P-sub there is a Nwell node connected to VDD1. The simulation results of a Recall operation based on DRAM-like charge scheme are shown below in FIG. 4 under certain conditions.

Figure 4:
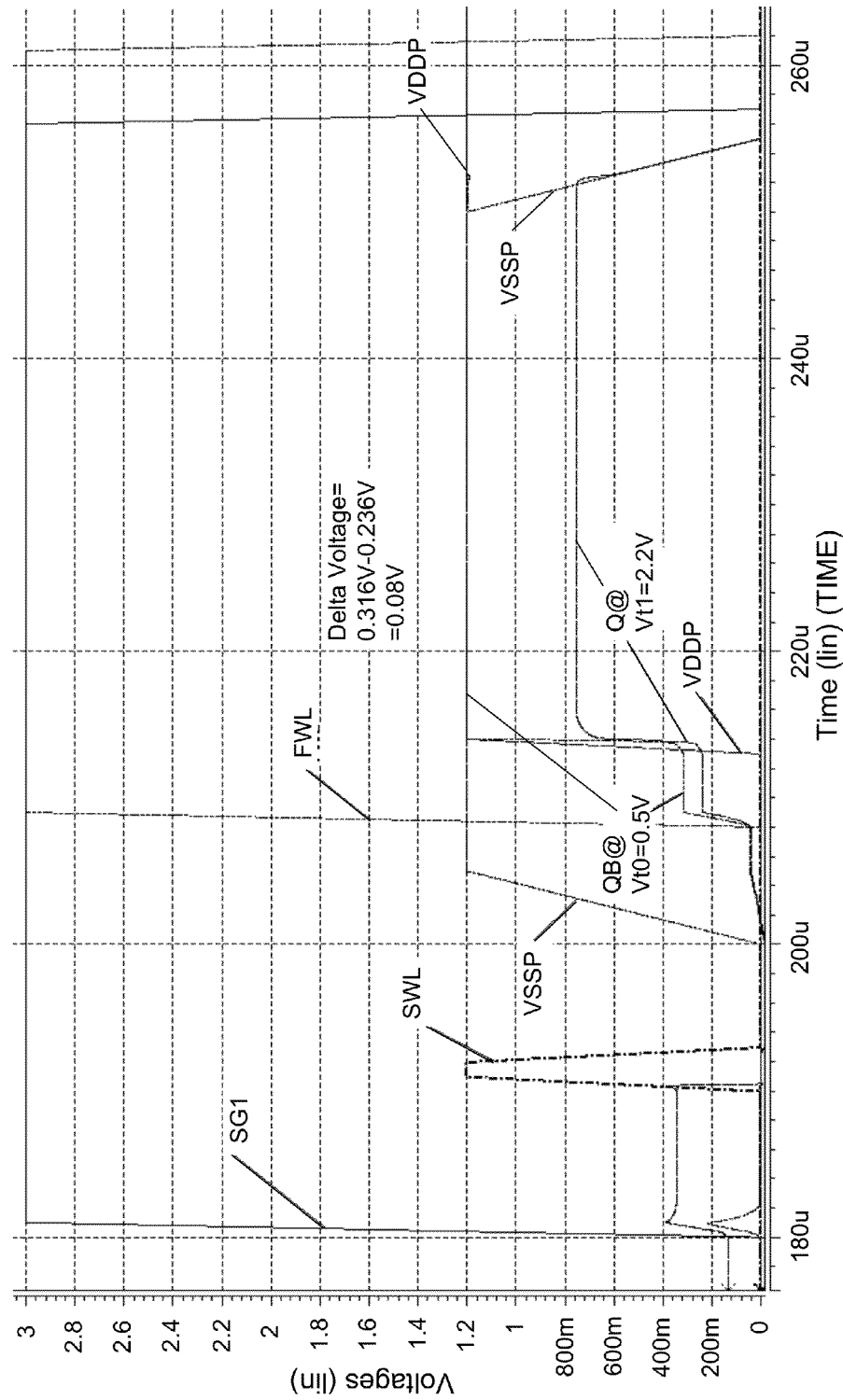
FIG. 4 is a diagram showing a set of simulation waveforms under a bias condition for the examination of Recall operation of the 10T NVSRAM cell in accordance with the present invention.

FIG. 4 shows a set of simulation waveforms that is executed under the extreme worst-case Q and QB capacitance loadings to allow the examination of this DRAM-like Recall operation under the following conditions. These conditions includes setting VDD=1.2V, MC1=Vt1, and MC2=Vt0 (Vt1>Vt0). Further, Q node has extra capacitance=CC1 in addition to the parasitic of SRAM devices and ST1 device. QB has extra capacitance=CC in addition to the parasitic of SRAM devices and ST2 device. During DRAM-read operation, the FWL ramps from VSS to 3V. The initial voltages at both nodes of Q and QB are set to VSS. And SWL=VSS, SG1=3V. VDD1=VDD. The SRAM power line VDDP/VSSP ramp rate=1.8V/1 µs.

Referring to FIG. 4, it shows the initial Q and QB voltages start from a set value at VSS=0V between 0 µs and 200 µs period. This 0V setting can be done by coupling both BL and BLB of SRAM cell to VSS with SWL held at VDD and SRAM power supply turned off (both VDDP and VSSP set to VSS). At timeline 200 µs, VSSP is ramped first to VDD=1.2V and VDDP stays at VSS to set up the two inverters for preventing charge leakage and ready for later amplification operation. Around 210 µs, the flash's gate, FWL, is ramped up from VSS to 3V to induce charge coupling in the Flash transistors. Due to Flash stored Vts (Vt0 and Vt1) are different, the Q and QB are then coupled to respective values with a small voltage gap.

In the simulation, the Vt0 and Vt1 are assigned to: Vt0=0.5V and Vt1=2.2V. Then the ΔVt=Vt1−Vt0=1.7V. From timeline 208 µs to 212 µs, the voltage gap between QB=CC and Q=CC1 node of about 0.08V is induced by the charge coupling effect by ramping FWL to 3V to sense the ΔVt of flash paired transistors. Then FWL remains constant because there is no obvious junction leakage until after 212 µs when the NVSRAM cell enters into an amplification period to amplify the gap. First, VDDP power line ramps up from VSS to full VDD level of 1.2V. The Q voltage level is increased to the VDD=1.2V level while QB is also increased to 0.78V. After timeline 250 μs, the VSSP power line ramps down from VDD to VSS=0V as a second step amplification. The Q voltage level stays at VDD=1.2V, while QB voltage level is dropped to VSS=0V. Now, QB node voltage has been fully amplified to respective VDD and Q node voltage to VSS of a logic state "0" in SRAM, which is an opposite polarity to the logic state "1" of Flash cell (with MC1 at Vt1=2.2V and MC2 at Vt0=0.5V).

The reason in the two cases that the QB node voltage is amplified to VDD is because QB node is connected to a flash transistor that stores a low Vt level of Vt0. Therefore, it has been turned on earlier than the flash transistors storing a high Vt level of Vt1. Therefore, when the flash transistor gate signal FWL is ramped up from VSS to a >VDD level, the lower Vt0 flash transistor is turned on first with a full channel capacitance. Thus, the flash transistor with lower Vt0 will contribute more coupling charges from the flash gate signal FWL to the QB node.

Conversely, the reason in the above two cases that the Q node voltage is amplified to VDD is because Q node is connected to a flash transistor that stores a high Vt level of Vt1. Therefore, it has been turned on later than the flash transistors storing a low Vt level of Vt0. Therefore, when Flash's gate is ramped up from VSS to >VDD level, the low Vt0 flash transistor is being turned on first but later for the high Vt1 flash transistor. As a result, the Vt1 flash transistor will contribute less coupling charges from the flash gate signal FWL to the Q node. When VDDP line voltage ramps up and VSSP line voltage ramps down, the small different voltage gap in Q and QB initially coupled from the charge difference due to Vt1 and Vt0 difference would be amplified as those skilled in SRAM and DRAM would appreciate.

In certain embodiment, revealed from the simulation results shown in FIG. 4, the FWL voltage is flexible. In case shown above, the FWL ramping to 3V turns on both Flash transistors. In other cases (not shown), FWL can ramp to just the Vt1 (2.2V) level to turn one flash transistor Vt0=0.5V but turns off another flash transistor with Vt1=2.2V. As a conclusion, the gate voltage value is not critical, but it requires at least higher than Vt0.

In other embodiments, both Q node and QB node initially are set to VSS with a gap after the FWL ramps up at around 210 μs to couple the different charges to Q and QB nodes. When the SRAM power line VDDP ramps up at about 212 μs followed by power line VSSP ramps down at about 250 μs, both Q node and QB node will be amplified to VSS and VDD respectively as also done in the first simulation shown in FIG. 4. In a specific embodiment, the ramping rate of both the flash gate signal FWL and SRAM power level via VDDP and VSSP lines would not critical to the results.

All simulation results show that VDDP/VSSP and FWL ramping time control can be very flexible. The most important is the ΔVt of the paired flash transistors. The simulation results further show that the 10T NVSRAM cell using the popular DRAM-like charge-coupling sensing scheme and amplification method works during the NVSRAM Recall operation.

In an alternative embodiment, the present invention provides a 10T NVSRAM cell including one LV 6T SRAM cell and one HV 4T Flash cell that further comprises one paired fully symmetrical 2T Flash transistor (2T) and one paired top Select transistor (2T), while the two source nodes of the paired Flash transistor are tied to a common source line configured to supply currents for cell operation. Several options of preferred Program and Erase schemes can be used for the 10T NVSRAM cell including 1) FN-channel scheme which is a low-current with a positive high voltage VPP applied to a common gate of the paired Flash transistors to increase their threshold levels Vts within 1-5 ms through Flash transistor channel and with a negative high voltage VNN applied to the common gate of the paired Flash transistors to decrease their Vts within 1-5 ms. 2) FN-edge scheme which is another low-current scheme used to decrease the paired Flash transistor Vt within 1-5 ms through Flash drain and source edge.

The FN-edge scheme can create larger ΔVt between the paired flash transistors over the counterparts of FN-channel due to the strong electric field at edge than channel. The ΔVt is detected from the paired Flash's different programmed Vts and then exemplified by each 6T SRAM cell during a Recall operation of the 10T NVSRAM cell. For reliable ΔVt detection, the paired Flash transistors are configured into a paired Voltage Followers with their respective drain and gate voltages are coupled to the preferred voltages with the details to be explained thereafter of this specification.

The regular operation of a so-called paired Voltage-Follower needs to meet the following equation of $$Vgs-Vtn \leq Vds,$$

where Vgs is the gate voltage of Flash pairs. Vtn is the individual programmed Vt values stored in paired flash transistors. Vds is the voltage drop across the paired Flash transistors drain and source nodes.

The goal of ΔVt is to achieve ΔVt≥1V. The detailed steps for operating the 10T NVSRAM cell and array in different operations will be explained below in accordance with the spirit of the present invention.

Figure 5A:
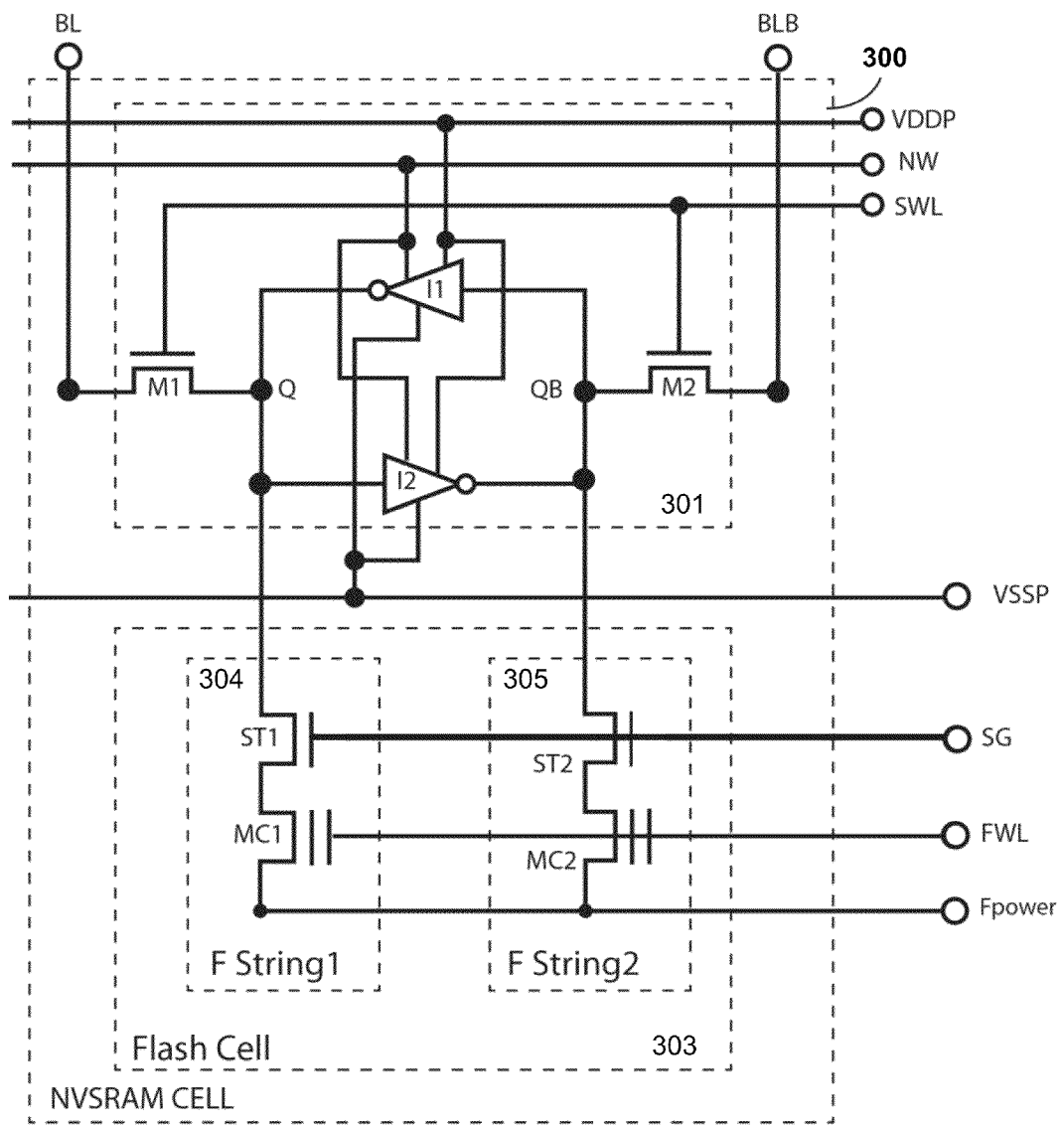
FIG. 5A is a circuit diagram of a 10T 2-poly NMOS floating-gate flash type NVSRAM cell according to an alternative embodiment of the present invention.

FIG. 5A shows a 2-poly NMOS 10T NVSRAM cell according to a specific embodiment of the present invention. As shown, the 10T NVSRAM cell 300 comprises one 6T LV SRAM cell 301 and one 4T NMOS 2-poly Flash cell 303 that has one paired NMOS 2T Flash strings, FString1 304 and FString2 305. The SRAM cell 301 has two Inverters I1 and I2 respectively with two output nodes Q and QB connected to bit lines BL and BLB through two LV NMOS device M1 and M2 controlled by word line SWL. The two Inverters I1 and I2 are powered from a common power line VDDP for powering PMOS devices and another power line VSSP for power NMOS devices to charge/amplify charges from bit lines to the two nodes Q and QB by drawing currents.

In a specific embodiment, each 4T NMOS 2-poly Flash cell 303 comprises two fully symmetrical 2T NMOS 2-poly Flash strings 304 and 305. Each 2T flash string, e.g., FString1 304 includes one NMOS 2-poly Flash transistor (1T) MC1 placed in bottom in series with one top 1-poly or 2-poly Select transistor (1T) ST1. In addition, the bottom paired source nodes of the above paired 2T Flash strings are connected to a common power line Fpower. The top Select transistor ST1 can be made of 2-poly or 1-poly Flash transistor. The 1-poly Select transistor means the gates of the poly2 and poly1 layers are shorted. Similarly, the FString2 305 further includes one Select transistor ST2 on top and one 2-poly NMOS Flash transistor MC2 on bottom with its source node connected also to the common power line of Fpower. The paired Select transistors ST1 and ST2 are commonly gated by a Select gate signal SG and the paired Flash transistors MC1 and MC2 are commonly gated by a single flash word line FWL.

In a specific embodiment, this 2-poly 10T NVSRAM cell can use a first write scheme that employs a −18V VNN to the FWL to decrease NMOS flash's Vt during the FN-channel Erase operation and a +18V VPP to the FWL to increase NMOS flash transistor Vt during the FN-channel Program operation. In another specific embodiment, this 2-poly 10T NVSRAM cell can also use a second write scheme that employs a +18V VPP to the FWL to increase NMOS flash Vt during a FN-channel erase operation and a −18V VNN under a FN-edge scheme to the FWL to decrease NMOS flash transistor Vt during program operation.

If ST1 and ST2 are 2-poly flash transistors, then their Vts are preferably set to be the same with a positive value of around 0.7V for a desired 1.2V VDD operation. This can be done by using a negative high voltage VNN under a FN-channel Erase scheme to decrease the Vt level first followed by using a positive high-voltage VPP under a FN-channel Program scheme to set around 0.7V with nodes Q=QB=VSS.

If ST1 and ST2 are poly1-gate flash transistors, then Poly1-gate Vt sets their Vts from flash process control. The poly1-gate is achieved by shorting poly2 and poly1 together. Since the speed of Flash string is not important, thus the shortage of poly1 and poly2 can be done per 32 or 64 NVSRAM cells in X-direction to save the layout area.

The 10T NVSRAM cell 300 is substantially the same as the 10T NVSRAM cell 100 shown in FIG. 1A, except that some biased conditions are different for using different operation schemes. Due to this paired fully symmetrical cell structure and layout, the parasitic capacitance on both Q and QB nodes and the connections to Flash drain nodes of the ST1 and ST2 can be configured to set up a good foundation for this preferred 10T NVSRAM cell to implement a current sensing scheme. For a Recall operation, operating currents are allow to flow from the common Fpower line to Q and QB nodes of each SRAM cell through the paired MC1 and MC2 stored with ΔVt and the paired Select transistors of ST1 and ST2.

Figure 6:
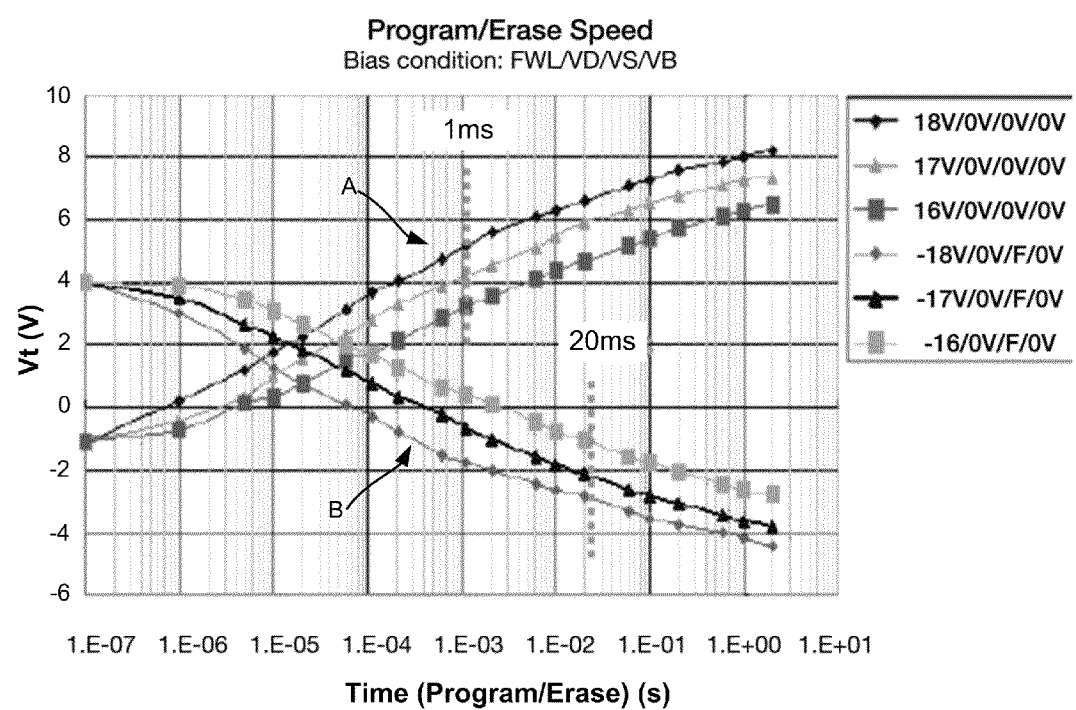
FIG. 6 is a diagram showing a NMOS Flash transistor threshold level Vt distribution versus time for a FN-channel Program operation using a positive VPP voltage to increase Vt and for a FN-channel Erase operation using a negative VNN to decrease Vt in accordance of the present invention.

FIG. 6 is a diagram showing a NMOS Flash transistor's threshold level Vt distribution versus time for a FN-channel Program operation using a positive VPP voltage to increase Vt and for a FN-channel Erase operation using a negative VNN to decrease Vt in accordance of the present invention. The FN-channel program scheme (curves A) in FIG. 6 is used for the present 10T NVSRAM cell to increase MC1 and MC2 Vts in the beginning With a 1V difference in gate but a same channel voltage, after 1 ms, the ΔVt can be 1V difference. Secondly, with 1 ms, the flash transistor Vt can be increased above positive 2V with gate voltage of +18V. This is used by this invention to set the paired flash Vt to be a positive value above VDD=1.8V in program operation. Alternatively, FIG. 6 also shows a FN-edge Write operation with respect to the erase graph B.

Figure 7:
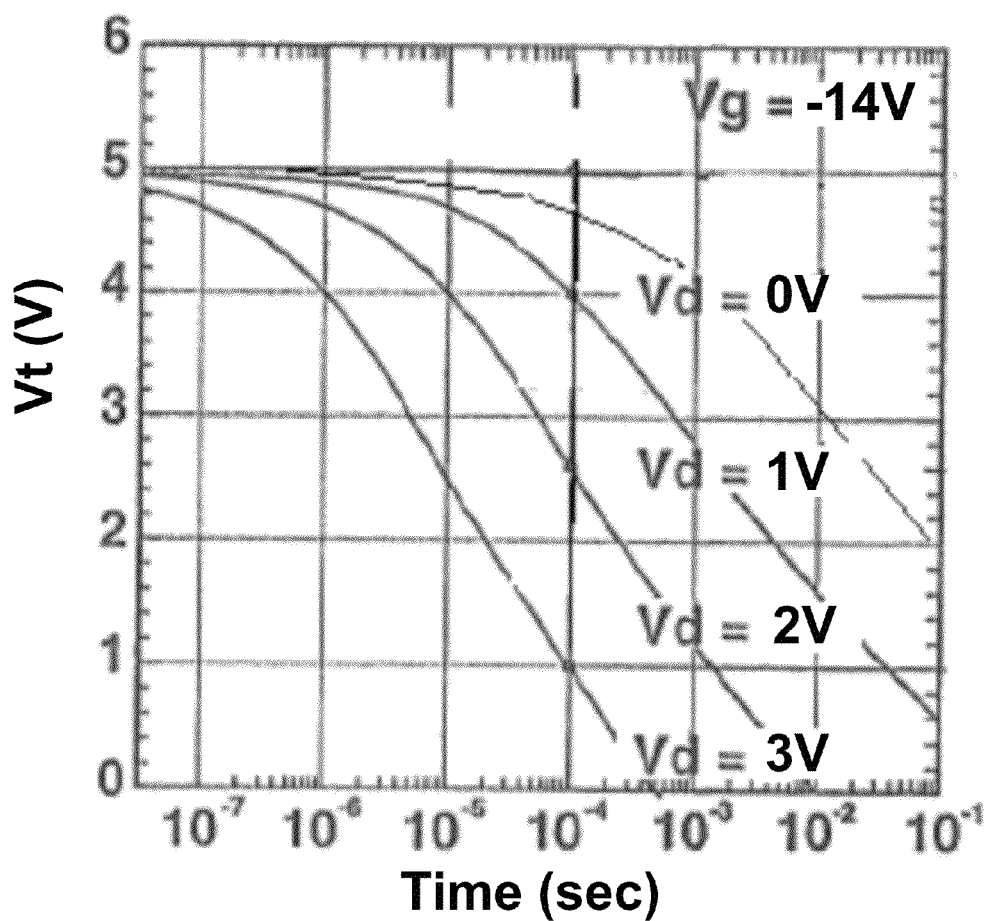
FIG. 7 is a diagram showing another Flash transistor threshold level Vt distribution versus time for a FN-edge Program operation to decrease both Vts of flash cells with a desired ΔVt≥1V, regardless of 1-poly or 2-poly flash type transistors in accordance with the present invention.

FIG. 7 is a diagram showing another Flash transistor threshold level Vt distribution versus time for a FN-edge Program operation to decrease both Vts of flash cells with a desired ΔVt≥1V, regardless of 1-poly or 2-poly flash type transistors in accordance with the present invention. In a specific embodiment, with 1V difference in the flash drain edges of MC1 and MC2 and a same gate voltage of −15V and a same floating source, after 100 μs program time, the ΔVt=0.8V is achieved, as shown in FIG. 7. But after longer program time of 1-5 ms, the ΔVt is increased and kept constant with a ΔVt≈1.5V, which is larger than 1.0V as produced by using VPP FN-channel scheme in same program time.

In summary, the FN-edge scheme has a stronger tunneling electric field than FN-channel scheme. Thus, with direct Q and QB voltage coupled to the paired flash cells without using SBPI method, the FN-edge scheme can generate about 1.5-fold ΔVt over the FN-channel scheme.

Besides, due to a very low VDD and VSS inputs from SRAM's Q and QB nodes to the paired flash cell, the channel length of MC1 and MC2 can be made with a minimum pitch to save the flash size, thus the cell size reduction for the 10T NVSRAM cell of the present invention.

One disadvantage of the SBPI scheme is that the channel length of each of the top and bottom Select transistors has to be bigger than 70 nm to prevent the Vds>5V punch-through from occurring during the SBPI operation. Thus the overhead of Select transistor is big. While the FN-edge scheme is used by this invention to allow the Program operation at VDD of as low as 1.2V without need of a SBPI method. Now, several optional operations of the 10T NVSRAM cell 300 shown in FIG. 5A will be described below with references to the illustrations of Vt distribution versus time for program and erase operations under different schemes in FIG. 6 and FIG. 7.

1) 6T SRAM's Read and Write operations: In each 6T SRAM independent operation, its corresponding 4T Flash cell is preferably electrically isolated by setting Select gate signal SG=VSS. Particular bias conditions are listed below:

A) Setting SWL=VDD for the select SRAM cells in a single selected SRAM word line WL, but SWL=VSS for the all non-select SRAM cells in non-selected N−1 SRAM word lines WLs.

B) Setting VDDP=VDD and VSSP=VSS.

C) Setting SG=VSS to disconnect the drain node of the Select transistor ST1 from Q node and the drain node of the Select transistor ST2 from QB node.

D) Setting flash word line FWL=X, which means the FWL voltage becomes don't-care and can be set either VDD or VSS.

E) Setting Fpower=X, which means PumpWL voltage becomes don't-care and can be set either VDD or VSS.

2) Flash operation: Setting SWL=VDD for the select SRAM cells in a single selected SRAM word line WL, but SWL=VSS for the all non-select SRAM cells in non-selected N−1 SRAM word lines WLs.

This includes two sub-operations such as FN-channel Erase to increase both paired flash transistors' Vt with a same initial preferred value Vt≥VDD and the FN-edge Program to decrease the paired flash transistors Vts with a desired ΔVt≥1V. The biased conditions are explained in more detail below with reference to FIG. 6 and FIG. 7. The two sub-operations are:

A) Erase operation: Using a preferred VPP FN-channel scheme to increase the paired MC1 and MC2 flash transistors Vts to a same preferred initial value of Vt1≥VDD.

TABLE 1

| 2-step Erase: | VDDP | SWL | BL | BLB | Q | QB | VSSP | SG | FWL | Fpower |
|---|---|---|---|---|---|---|---|---|---|---|
| $1^{st}$ step Isolation | VDD | X | X | X | X' | X' | VSS | VSS | VSS | VSS |
| $2^{nd}$ step Erase | VDD | X | X | X | X' | X' | VSS | VSS | VPP | VSS |

X: Don't care, i.e., either VDD or VSS.

X': both Q and QB in floating states with one voltage level higher than another.

In a first Isolation step, the SG=VSS and the SRAM cell is set to be a normal condition such as VDDP=VDD and VSSP=VSS and other signals are Don't-care as shown above. With SG=VSS and Vts of ST1 and ST2 are about 0.7V, thus both ST1 and ST2 are in a non-conduction state or a high-impedance state. The SRAM Q and QB nodes are isolated from MC1 and MC2 Flash transistors. As a result, Flash's Erase and Program operation would not affect the SRAM cell.

In a second Erase step, Fpower is set to be VSS=0V and the FWL is ramped up from VSS to a positive VPP, which is set to be +18V. In other words, FWL=VPP=+18V and Fpower=VSS. Both channels of two Flash transistors MC1 and MC2 are at VSS with gate voltage FWL ramped to the VPP. As a result, both MC1 and MC2 flash transistors Vt would be increased to a same positive erased Vt, referred as Vte. In the present invention, the preferred Vte is set to be larger than VDD level with a margin of 1V, e.g. Vte≥VDD+1V after a predetermined erase time of about 5 ms. As a result, Vte(MC1)≈Vte(MC2)≥VDD+1V, regardless of their initial values Vts assigned in last program operation.

B) Program operation: Using a preferred VNN FN-edge scheme to decrease the paired flash transistors' Vt from initial erased Vte to the final desired programmed Vtp with a desired Vt difference between MC1 and MC2 ΔVtp≥1.0V controlled by the voltage difference of VSS and VDD at Q and QB nodes. Note: bit lines BL=BLB="X" with reference to the biased conditions shown in the following TABLE 2.

TABLE 2

| 2-step Program | VDDP | SWL | MC1 Vt | MC2 Vt | Q | QB | VSSP | SG | FWL | Fpower |
|---|---|---|---|---|---|---|---|---|---|---|
| 1$^{st}$ step Preset | VDD | VSS | Initial Erased Vte | Initial Erased Vte | VDD/VSS | VSS/VDD | VSS | VDD + Vt | VSS | Float |
| 2$^{nd}$ step Program | VDD | VSS | Final Desired Vtp | Final Desired Vtp | VDD/VSS | VSS/VDD | VSS | VDD + Vt | VNN | Float |

In a first Preset step, SG is applied to VDD to pass VSS and VDD-Vt of Q and QB voltages to the respective drains of MC1 and MC2 with the common gate FWL tied to VSS through ST1 and ST2, where Vt is ST1 and ST2 threshold voltage which is around 0.7V. If the SG is applied to VDD+Vt, full passage of Q=VSS and QB=VDD nodes to the respective drains of MC1 and MC2 with both their source lines tied to a common node in floating state.

In an exemplary Case 1: With Q=VDD and QB=VSS initially, then MC1 drain voltage is VDD and MC2 drain voltage is VSS through respective Select transistors ST1 and ST2 with its common gate control line SG tied to VDD with the Vt of ST1 or ST2 at 0.7V.

In the second Program step, the FWL is ramped down from VSS to VNN of -15V to -18V. As a result, both flash transistor Vts would be decreased to two different values due to two different drain edge voltages of VSS and VDD.

With reference to FIG. 7, after a predetermined program time of 1-5 ms, a final programmed Vt difference ΔVtp>1.5V associated with the paired Flash transistor MC1 and MC2 can be achieved even at VDD=1V and VSS=0V condition. If VDD=1.8V, then ΔVtp>3V. Since MC1 drain voltage is VDD and MC2 drain voltage is VSS, thus the final programmed Vtp of MC1 would be lower than MC2. Thus, MC2 Vtp is approximately larger than MC1 Vtp by 1.5V if VDD=1V. But MC2 Vtp can be approximately larger than MC1 Vtp by 3.0V if VDD=1.8V.

It is preferable to make MC1 Vtp+0.5V<VDD<MC2 Vtp-0.5V for performing a better Flash Voltage Follower operation when FWL is ramped to VNN. In FIG. 7, the VNN=-15.5V with VDD=1V, then MC2 Vtp≈1.2V, while MC1 Vtp≈0V after 1-5 ms program time. Thus, it proves the present invention can support 1.2V VDD SRAM's operation to obtain ΔVtp≥1.5V.

In another exemplary Case 2: With Q=VSS and QB=VDD initially, then MC2 drain voltage is VDD and MC1 drain voltage is VSS through the two Select transistors ST1 and ST2 with gate control line SG tied to a VDD+Vt level, where Vt is channel threshold level of the ST1 and ST2 set to 0.7V. The final programmed Vtp of MC1 and MC2 would be reversed from the Case 1 above. As a result, MC1 Vtp is approximately greater than MC2 Vtp by about 1.5V if VDD=1V. In another example, MC1 Vtp is greater than MC2 Vtp by about 3.0V if VDD=1.8V.

3) Store operation: This operation is similarly defined as above combined first Erase and second Program operation to write each SRAM cell logic state into MC1 and MC2 paired flash transistors. Thus the detailed biased conditions are same as the above TABLE 1 and TABLE 2.

Typically, the final SRAM logic states would set up every Q and QB to the desired VDD and VSS voltage before Store operation is initiated. Then once the Store operation starts, the Q and QB voltages are forwarded to the respective drain voltages of MC1 and MC2 flash transistors through ST1 and ST2. In that time, the common gate SG of ST1 and ST2 is coupled to VDD+Vt to allow the full passage of VSS and VDD of Q and QB nodes to the drain nodes of MC1 and MC2 if VDD=1.2V to secure the drain voltage difference ΔVdrain at least ≥1V. For example, if VDD=1.8V, the common gate SG can be set to be VDD. The drain voltage of MC1 and MC2 would be respectively VSS and VDD-Vt. But because VDD=1.8V, then VDD-Vt=1.8V-0.7V=1.1V which meets the condition of ΔVdrain≥1V. As a result, the final ΔVtp≥1.5V is achieved when the FN-edge program scheme is used. There are three kinds of Store operations as explained below. Once any one the Store operation is initiated, the on-chip State-machine will take over the control to guide the procedures.

A) Auto-Store operation: This operation is performed upon the regular VDD power loss. Every SRAM cell logic data has to be written into its corresponding NVM Flash cell of MC1 and MC2 automatically in each 10T NVS-RAM cell.

B) Software-Store operation: This operation is performed upon the call of Software-Store command controlled initiated by the off-chip MCU. Usually, it involves a sequence of defined steps.

C) Hardware-Store operation: This operation is performed upon the call of hardware-Store command controlled by one pin and initiated by the off-chip MCU. Usually, it also involves a sequence of defined steps.

4) Recall operation: The operation is referred to a simulation circuit of FIG. 8A based on either one of the 10T NVSRAM cells shown in FIGS. 5A-5C and its associated result of simulation waveforms of FIG. 8B.

Figure 8A:
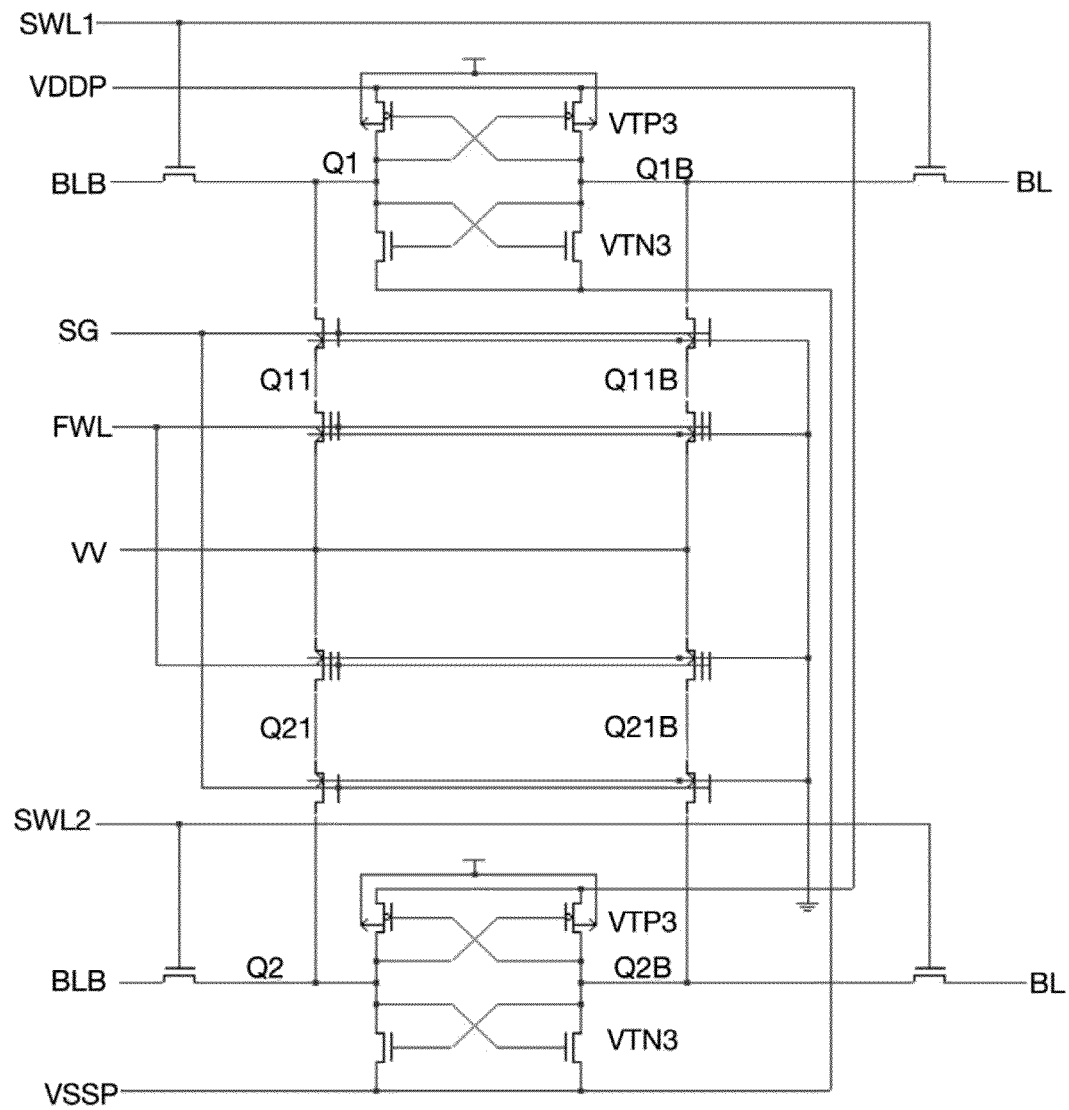
FIG. 8A is a simulation circuit of a 10T NMOS 2-poly NVSRAM cell for performing Recall operation with the paired Flash transistors' source nodes connected to a common power line of VDD along with a 2-step SRAM amplification in accordance with the present invention.

FIG. 8A shows a 10T NMOS 2-poly NVSRAM cell simulation circuit for NVSRAM cell Recall operation of a pair of 10T NVSRAM cells respectively with the paired Flash transistor source nodes connected to a shared Fpower line VV laid in the middle and a common SRAM power line of VDDP along with a 2-step SRAM amplification in accordance with the present invention. In a specific embodiment, FIG. 8A provides a paired 10T NVSRAM cell of FIG. 5A with a shared Fpower line in the middle. The SG1 and SG2 are tied together. Similarly, the FWL1 and FWL2 are also tied together. The VDDP and VSSP of top and bottom pseudo 10T NVSRAM cells are also tied together or separately but with the same voltage.

Since there are two Flash pairs of the one paired 10T NVSRAM cell, there are four logic states of Flash transistors as explained below. However, since the FPower is a string VDD source, the Recall operations of top and bottom 10T NVSRAM cells are not affected by each other and operate independently. Both top and bottom 10T NVSRAM cells can be programmed and erased simultaneously. In addition, the Store and Recall operations of both top and bottom NVSRAM cells can be done on the same time too. Once SG1=SG2=VSS, then both SRAM cells can be read and write independently as a normal two SRAM cells in two different WLs.

Assuming the VDD=1.2V in this simulation, the $\Delta Vtp \geq 1.8V$ can be achieved as explained above with reference to FIG. 7 when FN-edge program scheme is adopted. The larger $\Delta Vtp$, the superior $\Delta V_{Q-QB}$ at Q and QB nodes for each SRAM's amplification subsequently. In this simulation, we assumed the worst-case $\Delta Vtp=1.0V$ for letting MC1 Vtp at 2.2V but MC2 Vtp at 1.2V. The top and bottom NVSRAM cells have the identical MC1 and MC2 (or denoted as MC3 and MC4) with the corresponding Vt values, MC2 Vt=1.2V≤FWL=VDD=1.2V<MC1 Vt=2.2V.

In a specific embodiment, this 10T NVSRAM cell, e.g., the top 10T NVSRAM cell, uses the similar SRAM-like current charging scheme in a Recall operation to charge up Q and QB nodes of the top SRAM cell with a voltage difference of $\Delta V_{Q-QB}$ though the MC1 and MC2 paired Flash Voltage Follower. Due to the $\Delta Vtp>1.0V$ in the worst-case stored in the paired flash transistors, MC1 and MC2, with the initial set values of Q=QB=VSS and MC1 Vt (2.2V)>MC2 Vt (1.2V). With FWL=VDD=1.2V, the MC1 and MC2 Voltage Followers generate a voltage difference $\Delta V_{Q-QB} \approx 0.42V$ at Q and QB nodes of the top SRAM cells. The real Voltage-Follower function is not 100% reflected in the simulation results for the paired 10T NVSRAM cell in FIG. 8A due to the following reasons:

A) Threshold leakage current from Fpower to Q and QB through the corresponding Flash channels is counted due to the extremely small parasitic capacitance along the Q and QB paths.

B) $\Delta Vtp=1.0V$ but $\Delta V_{Q-QB} \approx 0.42V$, thus a voltage difference $\Delta V$ from detecting $\Delta Vtp=1.0V$ of one paired flash transistors corresponds to a difference $\Delta V_{Q-QB} \approx 0.42V$ at Q and QB nodes, the $\Delta V$ is about 50% reduction. But this is still good enough for the subsequent SRAM 2-step amplification to make the final $\Delta V_{Q-QB} \approx VDD-VSS=VDD$.

C) Due the sub-threshold leakage, the Q1B=Q2B=1.2V even the FWL=1.2V and Fpower=1.2V=VDD. But the voltages of Q1 and Q2=0.78V because MC2 and MC4 Vt=2.2V. The gate effect of 1.2V is about 1V from Vt=2.2V. Thus the MC2 and MC4 have better capability to block the full leakage. As a result, the Q and QB of either the top or the bottom SRAM cell will see different voltages of 1.2V and 0.78V for a safe Voltage Follower's operation and is reliable enough for the next SRAM 2-step amplification when the devices-mismatch might exist along the paths of Q and QB nodes.

The Recall operation is preferably divided into six steps as shown in the following TABLE 3:

TABLE 3

| Recall | 1st step | 2nd step | 3rd step | 4th step | 5th step | 6th step |
|---|---|---|---|---|---|---|
| Q1 | VSS | VSS | V1 | V3/VDD | VSS/VDD | VSS/VDD |
| Q1B | VSS | VSS | V2 | VDD/V3 | VDD/VSS | VDD/VSS |
| Q2 | VSS | VSS | V1 | V3/VDD | VSS/VDD | VSS/VDD |
| Q2B | VSS | VSS | V2 | VDD/V3 | VDD/VSS | VDD/VSS |
| BL | VSS | X | X | X | X | High/Low |
| BLB | VSS | X | X | X | X | Low/High |
| SWL1/SWL2 | VDD pulse | VSS | VSS | VSS | VSS | VDD |
| VDDP | VSS | VSS | VSS | Ramp to VDD | Stay VDD | VDD |
| Fpower | VSS | VSS | Ramp to VDD | Stay VDD | Stay VDD | VSS |
| VSSP | VSS | Ramp to VDD | VDD | VDD | Ramp to VSS | VSS |
| SG | VPP1 | VPP1 | VPP1 | VPP1 | VPP1 | VSS |
| FWL | VSS | Ramps to VDD | Stays VDD | Stays VDD | Stays VDD | VSS |
| Function | SRAM initial set Q = QB = VSS by pulsing SWL & connect SRAM & Flash Set VSSP = VDD VDDP = VSS | Setup the paired Flash Voltage Follower by setting FWL = VDD > Vtmin, under Vgs-Vt ≤ Vds | Detecting ΔVt stored In MC1 & MC2 or MC3 and MC4 by ramping Fpower = VDD | 1st SRAM Amplification by ramping VDDP = VDD | 2nd SRAM Amplification by ramping VSSP = VSS | Back to SRAM operation | where V1, V2, and V3, are some voltage levels associated with either Q and QB nodes during the SRAM amplification stage, VPP1 voltage is defined as VPP1≥VDD plus threshold level of select transistor to allow full passage of the detected ΔVtp from the paired MC1 and MC2 transistors through the paired ST1 and ST2 to the paired Q and QB nodes of each SRAM cell. During the Recall operation the common Nwell of the SRAM cell is held at VDD all the time. Depending on last programmed Vt levels in the paired Flash transistor MC1 and MC2, when the VDDP line is ramped from VSS to VDD, the Flash transistor with smaller Vt is associated with more current flowing through the corresponding Flash string. Accordingly the one SRAM data node Q or QB coupled to the corresponding Flash string will be amplified to VDD level first. Conversely, when the VSSP line is ramped from VDD to VSS, the other data node coupled to the Flash string that is associated with the Flash transistor with higher Vt will be pulled to the VSS=0V (or being amplified in other direction).

Note, TABLE 3 is designated for a cell structure that includes two mirrored top and bottom 10T NVSRAM cells sharing one common Fpower line coupled to corresponding top and bottom flash source lines. Both top and bottom 10T NVSRAM cells are subjected to the Recall operation independently so that TABLE 3 also is applicable to just a one-side cell structure with either top or bottom 10T NVSRAM cell only.

For a successful Voltage Follower operation, the values of the paired MC1(MC3) and MC2(MC4) have to be less than their common gate voltage, i.e., FWL=VDD>Vtmin. Vtmin means the minimum stored Vt level of the paired Flash transistors. In an example, a gate-to-source voltage Vgs of MC1 (or MC3) equals to VDD−Vt=1.2V−2.2V=−1V assuming VDD=1.2V and Vt of MC1 (or MC3) is at 2.2V. Thus no passage to the Q node which voltage stays at 0V. But Vt of MC2 (or MC4) is at 1.2V, the gate-to-source voltage Vgs of MC2 (or MC4) is VDD-Vt=1.2V−1.2V=0V, resulting in no passage to QB node which voltage is also at the initial 0V. Thus $\Delta V_{Q\text{-}QB} \approx VSS-VSS=0V$, no voltage difference appears at the paired Q and QB nodes. Therefore, the subsequent SRAM cells' amplification would fail to amplify the $\Delta V_{Q\text{-}QB}$ to a desired VDD and VSS.

But from the simulation waveform, it shows that the $\Delta V_{Q\text{-}QB} \approx 1.2V-0.78V=0.42V$. This is due to sub-threshold leakage on the extremely small parasitic capacitance on the paired Q and QB nodes. The Q1B=Q2B=1.2V but Q1=Q2=0.78V. Thus the Voltage Follower still works even the sub-threshold leakage exists.

Figure 8B:
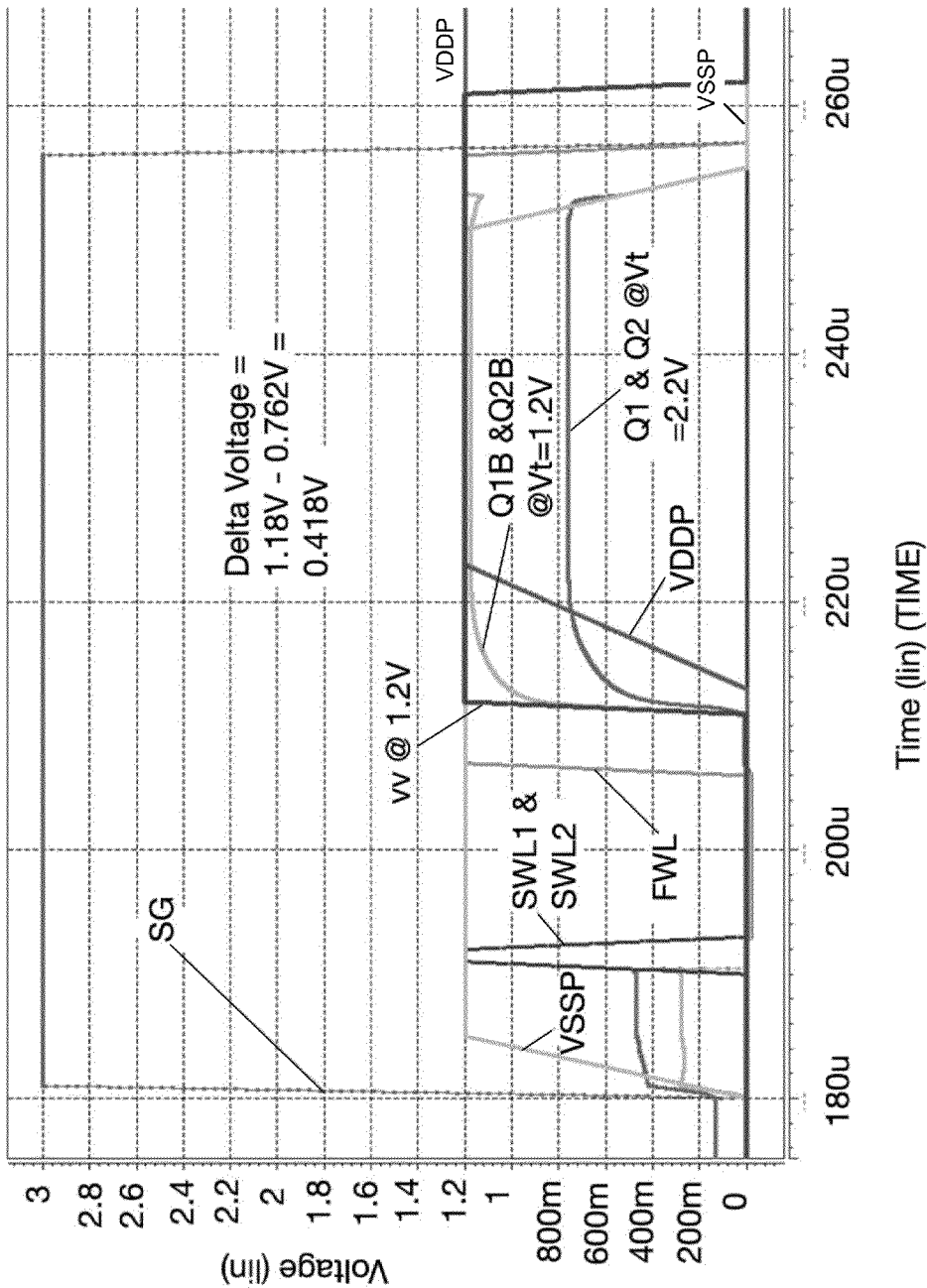
FIG. 8B is a plot of a set of simulation waveforms of the NMOS 2-poly NVSRAM cell of FIG. 8A in accordance with the present invention.

In FIG. 8B the simulation waveforms show at timeline 180 μs, the SG voltage is ramped to 3V, which is higher than VDD+Vt=1.2V+0.7V=1.9V, where Vt is the threshold voltage of ST1 and ST2 transistors. In this manner, the ST1 and ST2 would fully pass the detected ΔVtp stored between the MC1 and MC2.

Similarly, each SRAM VSSP line and the VDDP line are initially set at VSS. This is the first step of the Recall operation as explained in above TABLE 3.

At time line 190 μs at an earlier stage of a second step, both Q=QB=VSS with $\Delta V_{Q\text{-}QB}$=0V when SWL1=SWL2=VDD for a short duration to preset Q=QB=BL=BLB=VSS and later SWL1=SWL2=VSS to isolate Q and QB from BL and BLB in both top and bottom 10T NVSRAM cells. Now, the Q and QB nodes of each SRAM cell are ready to be charged up from initial same VSS voltage to a final voltage determined by the Vts and the sub-threshold leakage current of MC1/MC3 and MC2/MC4 and Fpower voltage which is up to VDD=1.2V in this simulation. During the second step, the SRAM cell is set up as a preparation for performing amplification later by setting power line VDDP reversely to VSS (stay at the initialized value) and power line VSSP ramped to VDD.

At timeline 206 μs, the FWL is ramped to VDD to enter into a later stage of the second step in TABLE 3. In this stage, the paired Flash transistors of paired transistors of MC1 and MC2 or MC3 and M4 are configured into a paired Voltage Follower that meets the condition of Vgs−Vt<Fpower when Fpower is ramped to VDD later. After that the ΔVtp is detected and pass to Q and QB with less than 50% $\Delta V_{Q\text{-}QB}$ at Q and QB nodes.

At timeline≈212 μs, the Fpower is ramped to VDD to enter into the third step in TABLE 3. The ΔVtp is detected and passed to Q and QB nodes in respective SRAM cells. A final $\Delta V_{Q\text{-}QB}$=0.42V is generated at Q and QB nodes of respective SRAM cells after time line 220 μs to 250 μs.

At timeline 213 μs, it enters into the fourth step of a Recall operation. The VDDP line of SRAM is ramped from VSS to VDD. This is the first amplification of the SRAM for this invention. Since the DC levels of both Q and QB are higher than VDD-Vtp where Vtp is the PMOS threshold of two Inverters of SRAM's Latch circuits. Thus from the simulation, in this first SRAM amplification stage, no gain in $\Delta V_{Q\text{-}QB}$=0.42V. In other case, if the DC level of Q and QB are below VDD-Vtp, then some gain can be achieved by ramping SRAM's VDDP line from VSS to VDD=1.2V.

At timeline 250 μs, it enters into the fifth step of a Recall operation. Conversely, the VSSP line of SRAM is ramped down from VDD to VSS. This is the second amplification of the SRAM for this invention. The Q1=Q2 voltage of 0.78V is pulled to VSS with Q1B=Q2B=VDD=1.2V. Thus, $\Delta V_{Q\text{-}QB}$=0.42V is increased to $\Delta V_{Q\text{-}QB}$=1.2V. As a conclusion, after the second SRAM amplification, Q and QB voltage difference $\Delta V_{Q\text{-}QB}$ becomes a full VDD. That concludes a fully successful Recall operation of this preferred 10T NVSRAM cell design.

After 255 μs time line, all the setup is reset to return to SRAM operation by setting SG=0V, Fpower=VSS, FWL=0V, SWL=VDD along with VDDP=VDD and VSSP=VSS. This is the sixth step of this NVSRAM's Recall operation. Note, during the seven steps of the Recall operation of 10T NVSRAM cell, the NW node of two Inverters, I1 and I2 of each 6T SRAM's cell is always kept at VDD without change. Only the power line, VDDP, of two Inverters of each SRAM are set to VSS first and then ramped to VDD later for the 2-step SRAM amplification.

Figure 5B:
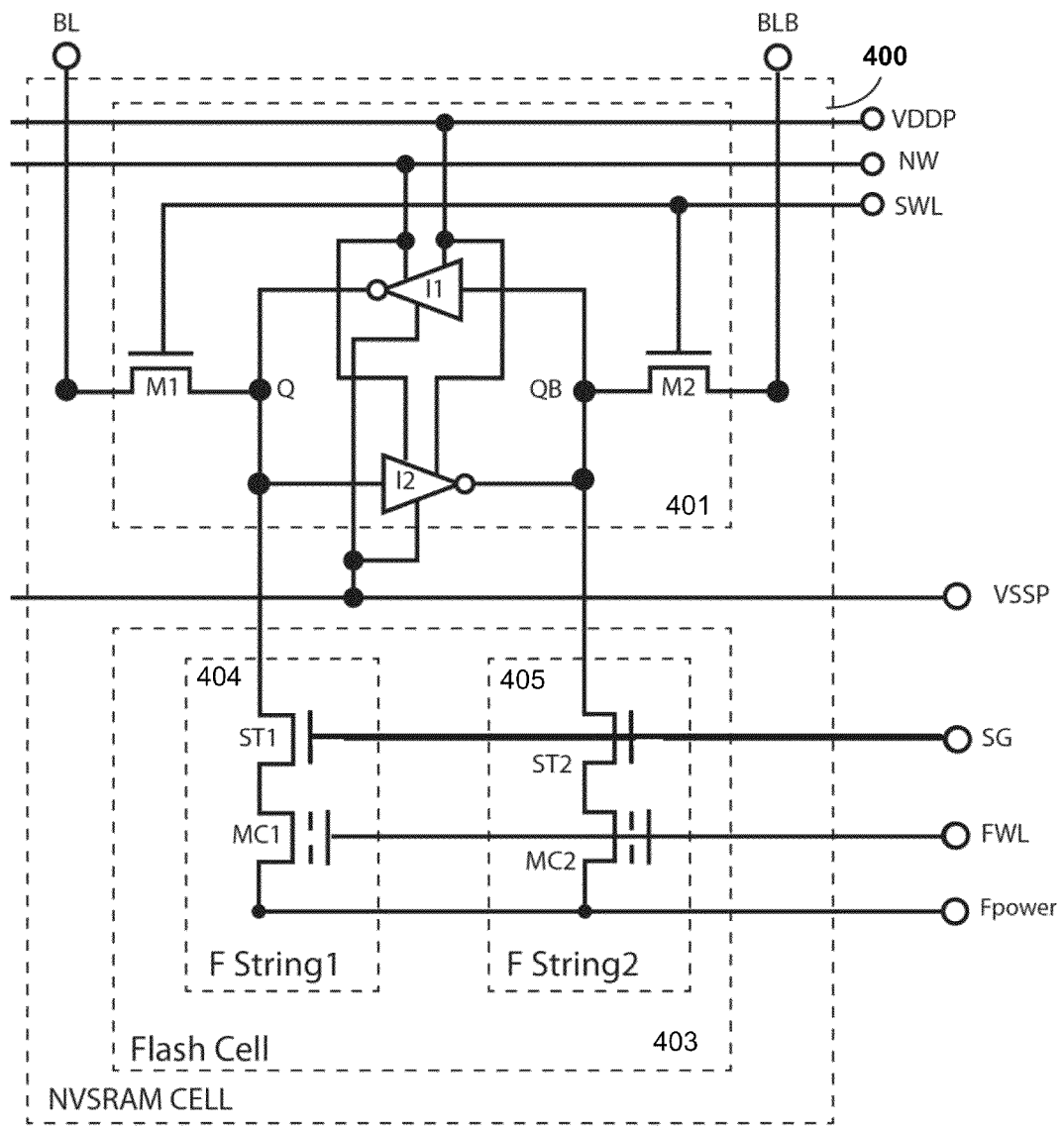
FIG. 5B is a circuit diagram of a 10T 1-poly SONOS or MONOS charge-trapping flash type NVSRAM cell according to another embodiment of the present invention.

The Recall operation of the 10T NVSRAM cell 400 of FIG. 5B should be substantially the same as the Recall operation described above for the 10T NVSRAM cell 300 shown in FIG. 5A in reference with FIG. 8B. In other words, the Recall operation is also divided into the six steps as shown in Table 3. The voltages setup in each step can be identical to the ones as explained in above. The difference is the VPP voltage applied to FWL. For 1-poly 10T NVSRAM cell shown in FIG. 5B, the highest coupling FWL voltage is limited by +10V, but 18V for 2-poly 10T NVSRAM cell shown in FIG. 5A.

Figure 5C:
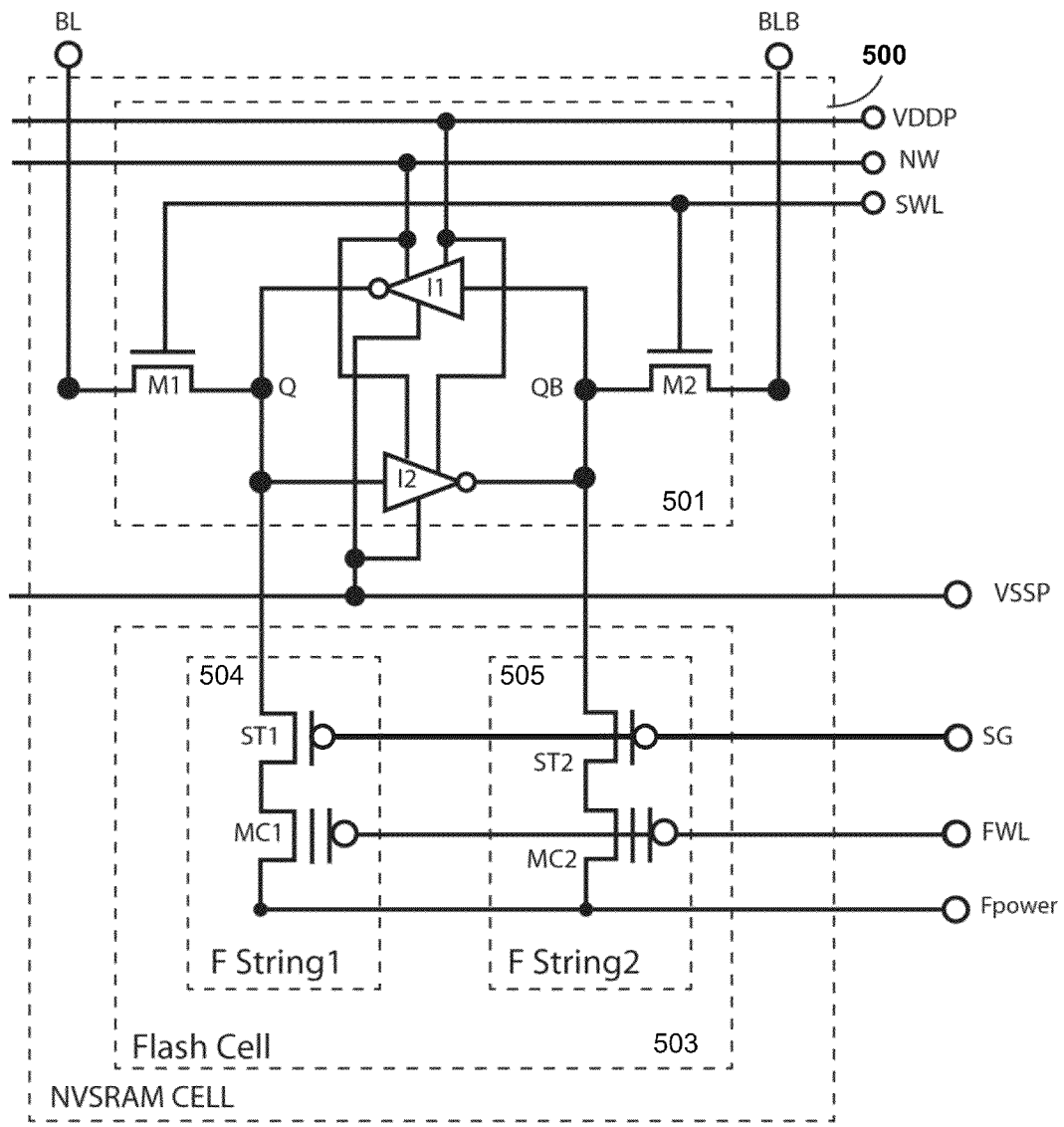
FIG. 5C is a circuit diagram of a 10T 2-poly PMOS floating-gate flash type NVSRAM cell according to yet another embodiment of the present invention.

The Recall operations of the 10T PMOS NVSRAM cell of FIG. 5C also should be the substantially similar to one above divided into similar six steps. The bias voltages setup in each step can be identical except the polarity in SG and FWL due to that the transistor device changes from NMOS to PMOS. For example, the Select gate control signal SG of the PMOS select transistors ST1 and ST2 in FIG. 5C should be connected to a negative voltage VNN1, which is −VDD−Vtp, to fully pass the detect ΔVtp of PMOS flash transistors MC1 and MC2 transistors in the first step of the Recall operation. Besides, setting FWL=VDD initially in the first step and then ramped to VSS at the third step, as opposite to the 10T NMOS NVSRAM cell of FIG. 5A. The rest of operation and steps are substantially the same, thus the description is skipped here for brevity.

In summary, there are two preferred combination sets of biased conditions of Erase and Program operations for the 10T NVSRAM cells according to embodiments of the present invention. These two sets of biased conditions are shown in the following TABLE 4. For a low 1.2V VDD operation, the first set of biased conditions is preferable over the second set due to a larger ΔVte.

TABLE 4

| Operations | First Set | Second Set |
|---|---|---|
| Erase | a) Use FN-channel to increase the Vt to Vte of MC1 and MC2 simultaneously<br>b) FWL = VPP = +18 V, MC1 Channel = MC2 channel = VSS | a) Use FN-channel to decrease the Vt of MC1 and MC2 simultaneously<br>b) FWL = VNN = −18 V, MC1 Channel = MC2 channel = VSS |
| Program | a) Use FN-edge to decrease the Vte to Vtp of MC1 and MC2 simultaneously to achieve ΔVt > 1 V<br>b) FWL = VNN = −15 V to −18 V<br>MC1 drain edge = VDD/VSS and<br>MC2 drain edge = VSS/VDD | a) Use FN-edge to increase the Vt of MC1 and MC2 simultaneously to achieve ΔVt > 1 V<br>b) FWL = VPP = +18 V<br>MC1 channel = VDD/VSS and<br>MC2 channel = VSS/VDD |

Although the above has been illustrated according to specific embodiments, there can be other modifications, alternatives, and variations. It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A 10T NVSRAM memory cell circuit with a DRAM-like charge-sensing scheme, the 10T NVSRAM memory cell comprising:
a SRAM cell comprising two inverters cross-coupled to a first pass transistor and a second pass transistor commonly gated by a first word line and respectively coupled drains to a first bit line and a second bit line and sources to a first data node and a second data node, the first data node and the second data node respectively being outputted from the two invertors, each inverter including a PMOS device connected to a first power line and a NMOS device connected to a second power line, the first power line and the second power line being operated between a VDD power supply and ground and being separated from a common Nwell node; and
a Flash cell comprising a first cell string and a second cell string sharing a common P-sub, the first/second cell string including a first/second Select transistor and a first/second Flash transistor connected in series, the first and the second Select transistors being gated commonly by a select-gate control line and respectively associated with a first drain terminal coupled to the first data node and a second drain terminal coupled to the second data node, the first and the second Flash transistors being gated commonly by a second word line and respectively associated with a first source terminal and a second source terminal, the first source terminal and the second source terminal being floating;
wherein the second word line is configured to ramp up to a voltage above the VDD level sufficient to couple two different charge levels respectively from the first Flash transistor and the second Flash transistor to the first data node and the second data node, the SRAM cell uses the two cross-coupled inverters to amplify the two different charge levels to one at the VDD level and another one at VSS in a two-step operation;
wherein the first Flash transistor and the second Flash transistor are configured to flexibly increase their channel lengths to make a difference of the two different charge levels coupled to the first data node and the second data node to be substantially larger than any unmatched parasitic capacitance between the first data node and the second data node.

2. The 10T NVSRAM memory cell of claim 1 wherein each of the first Flash transistor and the second Flash transistor is selected from a 2-poly NMOS floating-gate type transistor, a 1-poly SONOS or MONOS charge-trapping type transistor, and a 2-poly PMOS floating-gate type transistor.

3. The 10T NVSRAM memory cell of claim 1 wherein each of the first Select transistor and the second Select transistor is selected from a 1-poly NMOS transistor, a 1-poly PMOS transistor, a 2-poly NMOS floating-gate type with a poly1 layer and poly 2 layer shorted, and a 2-poly PMOS floating-gate type with a poly1 layer and poly 2 layer shorted.

4. The 10T NVSRAM memory cell of claim 1 wherein the SRAM cell is subjected to a Read and Write operation by setting the first word line to the VDD level if the SRAM cell is selected or to VSS=0V if the SRAM cell is not selected and applying the VDD level to the first power line and VSS=0V to the second power line, while setting the select-gate control line to VSS=0V to isolated each SRAM cell from each corresponding Flash cell.

5. The 10T NVSRAM memory cell of claim 1 wherein the Flash cell is subjected to an Erase operation by applying a negative high voltage VNN to the second word line to decrease threshold levels of both the first Flash transistor and the second Flash transistor to a level below −2.0V under a FN-channel tunneling scheme in less than 10 ms, along with applying the VDD level to the first power line and VSS=0V to the second power line, setting the common P-sub to 0V and setting the select-gate control line to VSS=0V.

6. The 10T NVSRAM memory cell of claim 5 wherein VNN is ranged from −15V to −18V for a 2-poly NMOS or PMOS type of the Flash cell or about −10V for a 1-poly SONOS or MONOS type of the Flash cell.

7. The 10T NVSRAM memory cell of claim 1 wherein the Flash cell is subjected to a Program operation for defining a flash logic state, the Program operation being associated with an initial setup condition of setting the select-gate control line and the second word line to the VDD level, applying the VDD level to the first power line and VSS=0V to the second power line, and loading a logic state "0" of the SRAM cell with the first data node at VSS=0V and the second data node at the VDD level, the Program operation including ramping up the second word line from the VDD level to a positive high voltage VPP using a FN-channel tunneling scheme to increase threshold level of the first Flash transistor from an initial level <−2.0V to a final level ≥2.0V and to retain threshold level of the second Flash transistor at the initial level, thereby storing the flash logic state "1" in the Flash cell.

8. The 10T NVSRAM memory cell of claim 7 wherein the Flash cell is subjected to a Program operation being associated with an initial setup condition of setting the select-gate control line and the second word line to the VDD level, applying the VDD level to the first power line and VSS=0V to the second power line, and loading a logic state "1" of the SRAM cell with the first data node at the VDD level and the second data node at VSS, the Program operation including ramping up the second word line from the VDD level to a positive high voltage VPP using a FN-channel tunneling scheme to increase threshold level of the second Flash transistor from the initial level <−2.0V to a final level ≥2.0V and to retain threshold level of the first Flash transistor at the initial level, thereby storing a flash logic state "0" in the Flash cell.

9. The 10T NVSRAM memory cell of claim 8 wherein the VPP is ranged from +15V to +18V for a 2-poly NMOS or PMOS type of the Flash cell or about +10V for a 1-poly SONOS or MONOS type of the Flash cell.

10. The 10T NVSRAM memory cell of claim 1 wherein the SRAM cell is subjected to a Recall operation for writing a flash logic state stored in the Flash cell back to the first data node and the second data node under a charge-sensing scheme, the flash logic state including at least a state "1" defined by a Vt1 threshold level for the first Flash transistor and a Vt0<Vt1 threshold level for the second Flash transistor or a state "0" defined by a Vt0 threshold level for the first Flash transistor and a Vt1>Vt0 threshold level for the second Flash transistor.

11. The 10T NVSRAM memory cell of claim 10 wherein the Recall operation for writing a flash logic state "1" to the SRAM cell comprises a bias condition of pulsing the first word line to the VDD level for setting the first data node, the second data node, the first power line, and the second power line to VSS, setting the select-gate control line to the VDD level plus threshold level of the corresponding Select transistor, ramping the second power line first from VSS to the VDD level and ramping the second word line from VSS to the voltage above the VDD level, and sequentially ramping the first power line from VSS to the VDD level while maintaining the second power line at the VDD level followed by ramping the second power line from the VDD level to VSS while maintaining the first power line at the VDD level.

12. The 10T NVSRAM memory cell of claim 11 wherein the voltage above the VDD level comprises a positive value near the Vt1 and still substantially smaller than a Flash programming voltage VPP of about +15V or higher.

13. The 10T NVSRAM memory cell of claim 11 wherein ramping the second word line from VSS to the voltage above the VDD level comprises at least inducing a first capacitance charge at the first Flash transistor and a second capacitance charge at the second Flash transistor, the second capacitance charge being more than the first capacitance charge due to Vt0<Vt1, and causing the first capacitance charge to pass through the first Select transistor to the first data node and the second capacitance charge to pass through the second Select transistor to the second data node.

14. The 10T NVSRAM memory cell of claim 13 wherein the first capacitance charge is retained in the first data node and the second capacitance charge is retained in the second data node by setting the first power line to VSS and the second power line to the VDD level.

15. The 10T NVSRAM memory cell of claim 13 wherein ramping the first power line from VSS to the VDD level while maintaining the second power line at the VDD level comprises pulling up the second capacitance charge at the second data node to substantially the VDD level in a first SRAM amplification operation.

16. The 10T NVSRAM memory cell of claim 13 wherein ramping the second power line from the VDD level to VSS while maintaining the first power line at the VDD level comprises pulling down the first capacitance charge at the first data node to substantially VSS=0V in a second SRAM amplification operation.

\* \* \* \* \*